US012413209B2

United States Patent
Park et al.

(10) Patent No.: US 12,413,209 B2
(45) Date of Patent: Sep. 9, 2025

(54) CLOCK SIGNAL GENERATOR AND OPERATING METHOD THEREOF

(71) Applicant: SAMSUNG ELECTRONICS CO., LTD., Suwon-si (KR)

(72) Inventors: Jihyun Park, Suwon-si (KR); Bilal Ahmad Janjua, Suwon-si (KR); Chiweon Yoon, Suwon-si (KR); Jungyu Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 63 days.

(21) Appl. No.: 18/416,527

(22) Filed: Jan. 18, 2024

(65) Prior Publication Data
US 2024/0267034 A1   Aug. 8, 2024

(30) Foreign Application Priority Data

Feb. 3, 2023   (KR) .......................... 10-2023-0014901

(51) Int. Cl.
*H03K 3/011*   (2006.01)
*G05F 3/26*   (2006.01)
(Continued)

(52) U.S. Cl.
CPC ............. *H03K 3/011* (2013.01); *G05F 3/262* (2013.01); *G11C 7/04* (2013.01); *G11C 16/32* (2013.01); *H03L 1/022* (2013.01)

(58) Field of Classification Search
None
See application file for complete search history.

(56) References Cited

U.S. PATENT DOCUMENTS 5,774,013 A      6/1998  Groe
6,020,792 A *    2/2000  Nolan .................. H03K 3/0231
                                                          331/111
(Continued)

FOREIGN PATENT DOCUMENTS

JP            5392225 B2      1/2014
KR         10-1104720 B1      1/2012
KR      10-2017-0006640 A     1/2017

OTHER PUBLICATIONS

Communication dated Jul. 15, 2024, issued by the European Patent Office in counterpart European Application No. 24152263.0.

*Primary Examiner* — Thomas J. Hiltunen
(74) *Attorney, Agent, or Firm* — Sughrue Mion, PLLC

(57)   ABSTRACT

A method of generating clock signals includes: receiving a bandgap reference voltage from a bandgap reference circuit; generating a first current having a first curvature characteristic based on the bandgap reference voltage; generating a second current having a second curvature characteristic based on the bandgap reference voltage; generating a first complementary to absolute temperature (CTAT) current by adding the first current to the second current; receiving a temperature-variable voltage and a temperature-fixed voltage from a voltage generator; generating an offset current based on the temperature-variable voltage and the temperature-fixed voltage; generating a reference current by adding the first CTAT current to the offset current; and generating the clock signals by alternately discharging a first capacitor and a second capacitor based on the reference current, and charging the first capacitor and the second capacitor based on a power voltage.

20 Claims, 21 Drawing Sheets

(51) Int. Cl.
*G11C 7/04* (2006.01)
*G11C 16/32* (2006.01)
*H03L 1/02* (2006.01)

(56) References Cited

U.S. PATENT DOCUMENTS

| | | | | |
|---|---|---|---|---|
| 6,856,566 | B2* | 2/2005 | Takahashi | G11C 11/4074 |
| | | | | 365/175 |
| 7,884,679 | B2* | 2/2011 | Mahooti | H03K 3/0231 |
| | | | | 331/70 |
| 7,978,017 | B2* | 7/2011 | Pernia | H03B 5/04 |
| | | | | 331/34 |
| 8,446,141 | B1 | 5/2013 | McGinn | |
| 8,508,307 | B2* | 8/2013 | Mitsuda | H03K 3/011 |
| | | | | 327/539 |
| 8,624,661 | B2 | 1/2014 | Oberhuber et al. | |
| 8,659,361 | B2* | 2/2014 | Matsuwake | H03L 1/022 |
| | | | | 331/158 |
| 8,710,939 | B2 | 4/2014 | Kim | |
| 8,736,387 | B2* | 5/2014 | Mahooti | G05F 3/30 |
| | | | | 331/185 |
| 8,941,369 | B2 | 1/2015 | Youssefi | |
| 9,046,910 | B2* | 6/2015 | Sako | H03L 1/022 |
| 9,325,276 | B2* | 4/2016 | Huynh | H03K 3/02315 |
| 9,685,238 | B2 | 6/2017 | Gangasani et al. | |
| 10,712,763 | B2 | 7/2020 | Mouret et al. | |
| 10,797,643 | B2* | 10/2020 | Kuwano | H03K 3/011 |
| 2016/0070294 | A1* | 3/2016 | Chung | G09G 5/12 |
| | | | | 331/8 |
| 2022/0239284 | A1 | 7/2022 | Yu et al. | |
| 2024/0249781 | A1* | 7/2024 | Kushida | G11C 16/30 |

* cited by examiner

CLOCK SIGNAL GENERATOR AND OPERATING METHOD THEREOF

CROSS-REFERENCE TO RELATED APPLICATION

This application is based on and claims priority to Korean Patent Application No. 10-2023-0014901, filed on Feb. 3, 2023, in the Korean Intellectual Property Office, the disclosure of which is incorporated by reference herein in its entirety.

BACKGROUND

The present disclosure relates to a clock signal generator and a memory device including the same.

A semiconductor memory device may include a plurality of memory cells for storing data. In addition, semiconductor memory devices may be classified into volatile memory devices and non-volatile memory devices depending on whether stored data is lost when power supply thereto is stopped. The operation characteristics of the memory cells may vary depending on changes in use environments, such as a temperature. The memory device may include a clock signal generator and may perform a program operation based on the clock signal. The cycle of the clock signal may be influenced by temperature. Thus, there is a need for a method of temperature compensation in relation to the clock cycle of the clock signal generator.

SUMMARY

One or more embodiments provide a clock signal generator in which the cycle of clock signal linearly changes with temperature in an environment with a large temperature change.

According to an aspect of an example embodiment, a method of generating clock signals includes: receiving a bandgap reference voltage from a bandgap reference circuit; generating a first current having a first curvature characteristic based on the bandgap reference voltage; generating a second current having a second curvature characteristic based on the bandgap reference voltage; generating a first complementary to absolute temperature (CTAT) current by adding the first current to the second current; receiving a temperature-variable voltage and a temperature-fixed voltage from a voltage generator; generating an offset current based on the temperature-variable voltage and the temperature-fixed voltage; generating a reference current by adding the first CTAT current to the offset current; and generating the clock signals by alternately discharging a first capacitor and a second capacitor based on the reference current, and charging the first capacitor and the second capacitor based on a power voltage.

According to another aspect of an example embodiment, a method of generating clock signals includes: receiving a bandgap reference voltage from a bandgap reference circuit; generating a first current having a first curvature characteristic based on the bandgap reference voltage; generating a second current having a second curvature characteristic based on the bandgap reference voltage; generating a first CTAT current by adding the first current to the second current; receiving a temperature-variable current and a temperature-fixed current from a current generator; controlling a first p-type metal oxide semiconductor (PMOS) transistor to generate a first offset current based on the temperature-fixed current; controlling a second PMOS transistor to generate a second offset current based on the temperature-variable current; generating an offset current based on the first offset current and the second offset current; generating a reference current by adding the first CTAT current to the offset current; and generating the clock signals by alternately discharging a first capacitor and a second capacitor based on the reference current, and charging the first capacitor and the second capacitor based on a power voltage. A source terminal of the first PMOS transistor is connected to a source terminal of the second PMOS transistor.

According to another aspect of an example embodiment, an apparatus includes: a CTAT current generating circuit configured to receive a bandgap reference voltage from a bandgap reference circuit, generate a first current having a first curvature characteristic based on the bandgap reference voltage, generate a second current having a second curvature characteristic based on the bandgap reference voltage, and generate a first CTAT current by adding the first current to the second current; an offset current generating circuit configured to receive a temperature-variable voltage and a temperature-fixed voltage from a voltage generator, generate an offset current based on the temperature-variable voltage and the temperature-fixed voltage, and generate a reference current by adding the first CTAT current to the offset current; and a clock signal generating circuit configured to generate clock signals by alternately discharging a first capacitor and a second capacitor based on the reference current, and charging the first capacitor and the second capacitor based on a power voltage.

BRIEF DESCRIPTION OF DRAWINGS

The above and other aspects and features of the present disclosure will be more clearly understood from the following description of example embodiments, taken in conjunction with the accompanying drawings, in which.

DETAILED DESCRIPTION

Figure 1A:
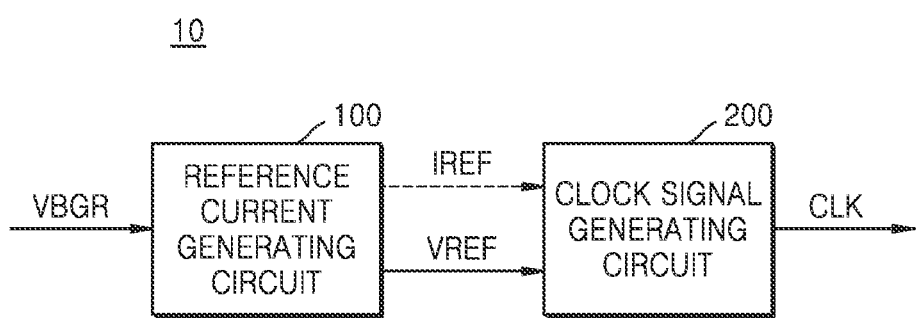
FIG. 1A is a block diagram showing a clock signal generator according to an example embodiment.

Hereinafter, example embodiments are described in detail with reference to the accompanying drawings. Embodiments described herein are provided as examples, and thus, the present disclosure is not limited thereto, and may be realized in various other forms. Each example embodiment provided in the following description is not excluded from being associated with one or more features of another example or another example embodiment also provided herein or not provided herein but consistent with the present disclosure. Herein, like reference numerals refer to like elements.

FIG. 1A is a block diagram showing a clock signal generator according to an example embodiment.

Referring to FIG. 1A, a clock signal generator 10 according to an example embodiment may include a reference current generating circuit 100 and a clock signal generating circuit 200.

The reference current generating circuit 100 may receive a bandgap reference voltage VBGR by using a bandgap reference circuit. The bandgap reference circuit may be a circuit that generates a reference voltage that is insensitive to a process-voltage-temperature (PVT). The bandgap reference voltage may be a voltage insensitive to temperature changes. The bandgap reference voltage VBGR may have a curvature characteristic. The reference current generating circuit 100 may generate a first current having a first curvature characteristic based on the bandgap reference voltage VBGR. In addition, the reference current generating circuit 100 may generate a second current having a second curvature characteristic based on the bandgap reference voltage VBGR. For example, the first current may be a complementary to absolute temperature (CTAT) current that is convex downward on a current-temperature graph. The second current may be a CTAT current that is convex upward on the current-temperature graph. The CTAT current may indicate a current in which the intensity of the current decreases as the temperature changes. Specifically, the first current may be a CTAT current in which the change rate of the current gradually increases as the temperature increases. The second current may be a CTAT current in which the change rate of the current gradually decreases as the temperature increases.

The reference current generating circuit 100 may generate a first CTAT current by adding the first current to the second current. For example, the reference current generating circuit 100 may generate the first CTAT current having no curvature characteristic by adding the first current to the second current, the first current and the second current having different convex directions in a current-temperature graph.

The reference current generating circuit 100 may receive a voltage or current that changes with temperature and a voltage or current that does not change with temperature. In an example embodiment, the reference current generating circuit 100 may receive a temperature-variable voltage, such as a voltage negative temperature coefficient (VNTC), and a temperature-fixed voltage, such as a voltage zero temperature coefficient (VZTC), from a voltage generator 930 in FIG. 12. In another example embodiment, the reference current generating circuit 100 may receive a temperature-variable current, such as current negative temperature coefficient (INTC), and a temperature-fixed current, such as current zero temperature coefficient (IZTC), from a current generator.

The reference current generating circuit 100 may generate an offset current based on the temperature-variable voltage and the temperature-fixed voltage. For example, the offset current may be a proportional to absolute temperature (PTAT) current and may increase as the temperature increases. As another example, the offset current may be a second CTAT current and may decrease as the temperature increases.

The reference current generating circuit 100 may generate a reference current by adding the first CTAT current to the offset current. For example, the reference current generating circuit 100 may generate a reference current IREF that is constant with changes in temperature, by adding the first CTAT current to the PTAT current. In another example, the reference current generating circuit 100 may generate a reference current that increases with temperature, by adding the first CTAT current to the PTAT current. In another example, the reference current generating circuit 100 may generate a reference current IREF that decreases with temperature, by adding the first CTAT current to the second CTAT current. In addition, the reference current generating circuit 100 may generate a reference voltage VREF.

The clock signal generating circuit 200 may include a first capacitor, a second capacitor, a first operational amplifier (OPAMP), a second operational amplifier, a plurality of transistors, and a latch circuit. The clock signal generating circuit 200 may be referred to as a resistance-capacitor oscillator or a relaxation oscillator. The reference voltage VREF may be applied to an input terminal of each of a first operational amplifier and a second operational amplifier. The clock signal generating circuit 200 may alternately discharge the first capacitor and the second capacitor based on the reference current IREF. In addition, the clock signal generating circuit 200 may charge both the first capacitor and the second capacitor based on a power voltage VDD. The clock signal generating circuit 200 may generate a clock signal by repeating the charging and discharging of the first capacitor and the second capacitor.

The clock signal generator 10 according to an example embodiment may compensate for the temperature of the clock signal generating circuit 200 by generating a bias current that does not vary with temperature. In addition, the clock signal generator 10 may control the cycle of the clock signals by applying an offset current that increases or decreases with temperature to the clock signal generating circuit 200. In addition, the clock signal generator 10 may control register variation by compensating for the temperature based on the current that changes with the temperature. In addition, the clock signal generated by the clock signal generator 10 may have linearity with temperature changes. In addition, the clock signal generator 10 according to an example embodiment may be designed to have low power consumption by performing temperature compensation based on electric current.

Figure 1B:
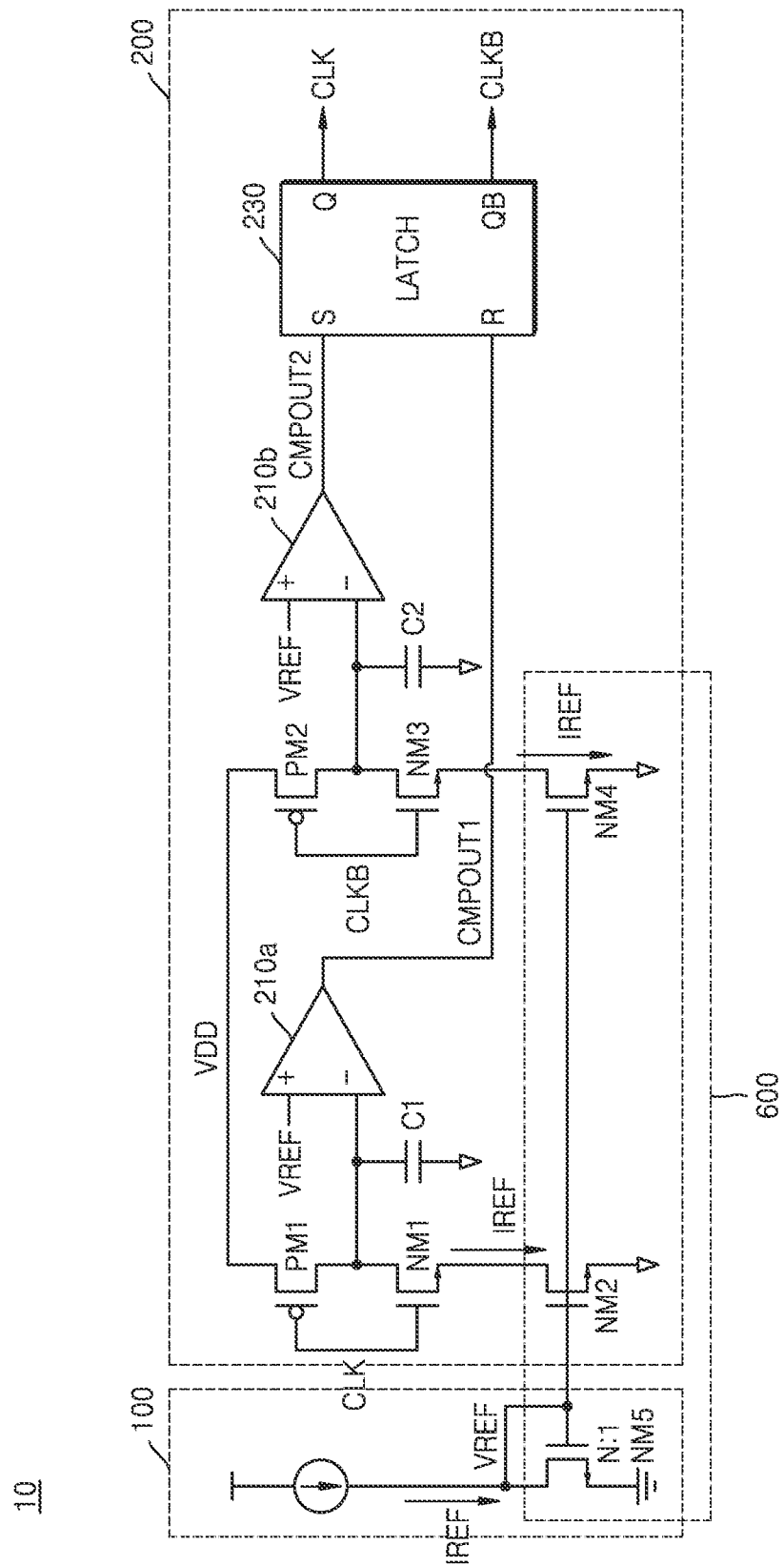
FIG. 1B is a view showing the clock signal generator according to an example embodiment.

FIG. 1B is a view showing the clock signal generator according to an example embodiment.

Referring to FIG. 1B, the clock signal generator 10 according to an example embodiment may include the reference current generating circuit 100 and the clock signal generating circuit 200. The reference current generating circuit 100 may generate a reference current IREF and a reference voltage VREF. The reference current generating circuit 100 may include an NMOS transistor NM5. The NMOS transistor NM5 may be a variable transistor and may include N transistors. For example, corresponding terminals of the N NMOS transistors may be connected to each other. For example, gates of each of the N NMOS transistors may be connected to each other, sources of each of the N NMOS transistors may be connected to each other and drains of each of the N NMOS transistors may be connected to each other The clock signal generating circuit 200 may include PMOS transistors PM1 and PM2, NMOS transistors NM1, NM2, NM3, and NM4, a first capacitor C1, a second capacitor C2, a first operational amplifier 210a, a second operational amplifier 210b, and a latch circuit 230. The reference voltage VREF generated in the reference current generating circuit 100 may be applied to an input terminal of each of the first operational amplifier 210a and the second operational amplifier 210b. The reference current IREF generated in the reference current generating circuit 100 may be mirrored by a current mirror 600. The amount of the mirrored current may be controlled by adjusting the number N of NMOS transistors NM5. That is, the amount of the mirrored current may be controlled by adjusting the number N of NMOS transistors NM5 of which each corresponding terminal is shared. In another example, the amount of current mirrored may be adjusted by adjusting the resistance of each of the NMOS transistors NM5, NM2, and NM4. The current mirror 600 may include a plurality of NMOS transistors NM5, NM2, and NM4.

The clock signal generating circuit 200 may generate clock signals CLK and CLKB. The first clock signal CLK may include a high-level logic signal. When the first clock signal CLK is a high-level logic signal, the first NMOS transistor NM1 may be turned on. When the first NMOS transistor NM1 is turned on, an electric current may flow from the first capacitor C1 to a ground node. Each of the first operational amplifier 210a and the second operational amplifier 210b may operate as a comparator. When the current flows from the first capacitor C1 to the ground node, the voltage of the first capacitor C1 may decrease. When the voltage of the first capacitor C1 is less than the reference voltage VREF, an output CMPOUT1 of the first operational amplifier 210a may be a low-level logic signal. Accordingly, the second clock signal CLKB may be a low-level logic signal. When the second clock signal CLKB is a low-level logic signal, the second PMOS transistor PM2 may be turned on. When the second PMOS transistor PM2 is turned on, a voltage VDD may be applied to the second PMOS transistor PM2. When the voltage VDD is applied to the second capacitor C2, the voltage of the second capacitor C2 may be higher than the reference voltage VREF. When the voltage of the second capacitor C2 is higher than the reference voltage VREF, an output CMPOUT2 of the second operational amplifier 210b may be high-level logic signal. The latch circuit 230 may provide the first clock signal CLK and the second clock signal CLKB based on the output CMPOUT1 of the first operational amplifier 210a and the output CMPOUT2 of the second operational amplifier 210b. A frequency of the cycle of the clock signals CLK may be inversely proportional to the reference current IREF. The reference current IREF may be constant throughout temperature changes, and thus, the clock cycle of the reference current IREF may have sufficient linearity with respect to the temperature changes. In addition, the reference current IREF may increase or decrease with the temperature changes, and thus, temperature compensation may be performed on the reference current IREF.

The cycle of the clock signals may be expressed as Equation 1 below.

$$Tclk = n * C * \frac{VDD - VREF}{IREF} \quad \text{[Equation 1]}$$

In Equation 1, Tclk denotes the cycle of the clock signal; n denotes the number of transistors in the NMOS transistor NM5; C denotes at least one of capacitance of the first capacitor C1 and the second capacitor C2; VDD denotes a supply voltage; VREF denotes the reference voltage VREF that is applied to the first operational amplifier 210a and the second operational amplifier 210b; and IREF denotes the reference current IREF generated by the reference current generating circuit 100 according to example embodiments.

Figure 2A:
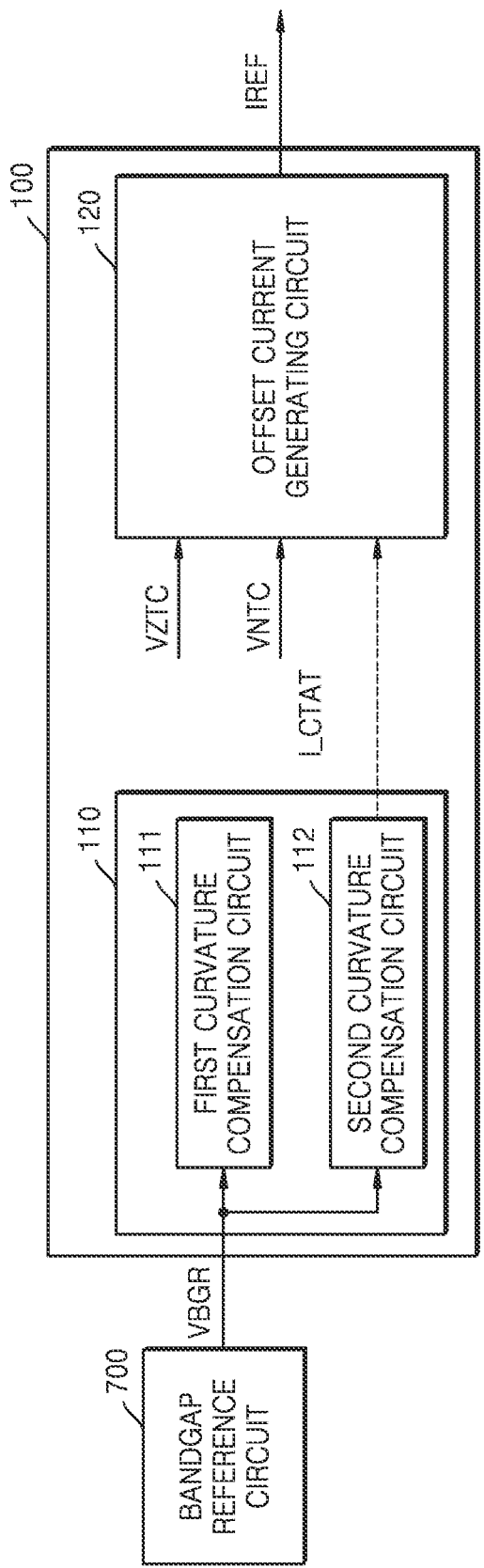
FIG. 2A is a block diagram showing a reference current generating circuit according to an example embodiment.

FIG. 2A is a block diagram showing a reference current generating circuit according to an example embodiment.

Referring to FIG. 2A, the reference current generating circuit 100 may include a CTAT current generating circuit 110 and an offset current generating circuit 120. The CTAT current generating circuit 110 may include a first curvature compensation circuit 111 and a second curvature compensation circuit 112. The first curvature compensation circuit 111 and the second curvature compensation circuit 112 may receive the bandgap reference voltage VBGR from a bandgap reference circuit 700. The first curvature compensation circuit 111 may generate a first current based on the bandgap reference voltage VBGR. The second curvature compensation circuit 112 may generate a second current based on the bandgap reference voltage VBGR. The first current may be a CTAT current that is convex downward on the current-temperature graph. The second current may be a CTAT current that is convex upward on the current-temperature graph. The first current may correspond to a current I_CTAT1 in FIG. 4A, and the second current may correspond to a current I_CTAT2 in FIG. 4A. The second curvature compensation circuit 112 may generate the CTAT current by adding the first current to the second current. The second curvature compensation circuit 112 may generate a first CTAT current, for example, I_CTAT in FIG. 4, having no curvature characteristic by adding the first current to the second current. The second curvature compensation circuit 112 may provide the CTAT current I_CTAT to the offset current generating circuit 120. For example, the offset current generating circuit 120 may mirror the CTAT current I_CTAT by the current mirror.

Figure 12:
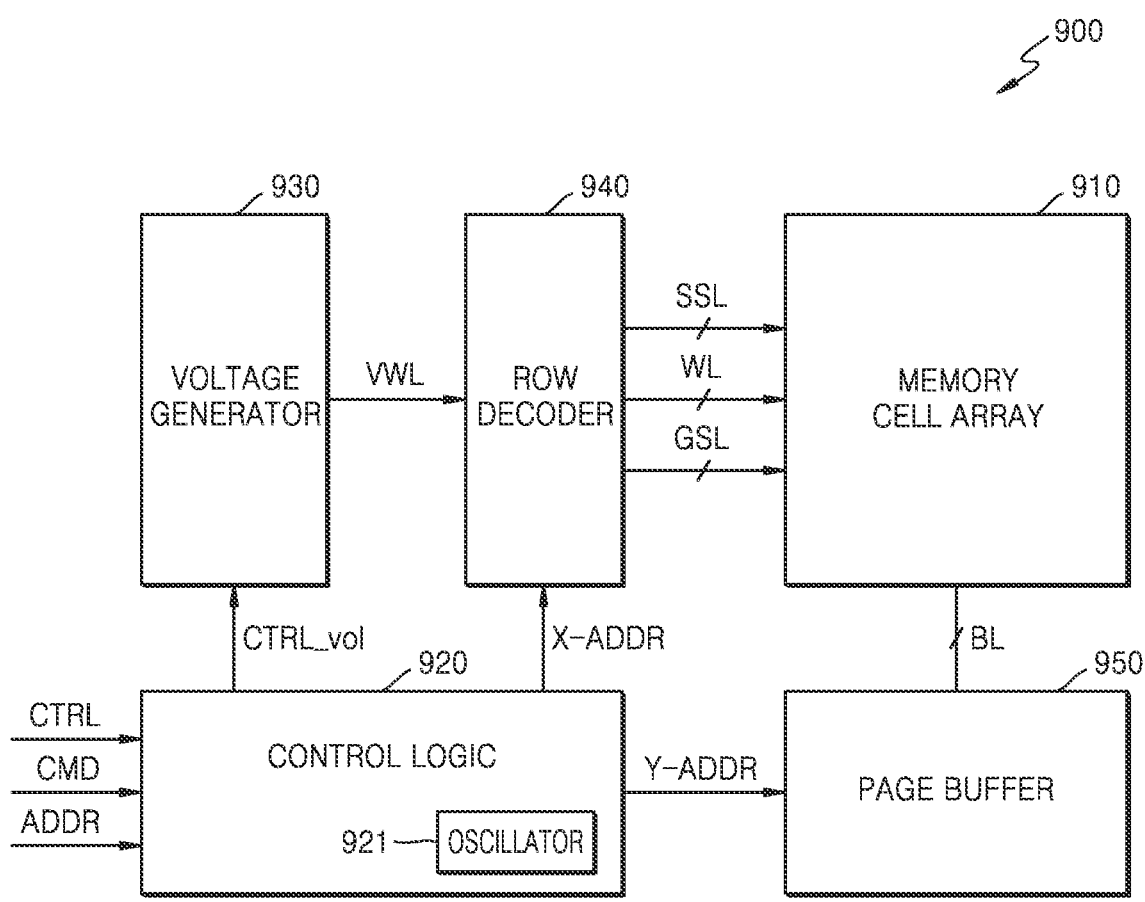
FIG. 12 is a block diagram showing a non-volatile memory device according to an example embodiment.

The offset current generating circuit 120 may receive the temperature-fixed voltage, such as VZTC, and the temperature-variable voltage, such as VNTC, from the voltage generator 930 in FIG. 12. For example, the offset current generating circuit 120 may include a first PMOS transistor and a second PMOS transistor, and the VNTC may be applied to a gate terminal of the first PMOS transistor and the VZTC may be applied to a gate terminal of the second PMOS transistor. A source terminal of the first PMOS transistor and a source terminal of the second PMOS transistor may be connected to each other. The offset current generating circuit 120 may generate the offset current based on the temperature-variable voltage, such as the VNTC, and the temperature-fixed voltage, such as the VZTC. For example, the offset current may be a PTAT current. In another example, the offset current may be a CTAT current. The offset current generating circuit 120 may generate the reference current IREF by adding the generated offset current to the CTAT current I_CTAT. For example, when the offset current is a PTAT current, the reference current IREF may also be an increasing (PTAT) current that increases with temperature. In another example, when the offset current is the PTAT current, the reference current IREF may be a constant current that is constant with changes in temperature. That is, the CTAT current I_CTAT and the offset current, which are added together, may be complementary to each other.

In another example, when the offset current is the CTAT current, the reference current IREF may be a decreasing (CTAT) current that decreases with temperature. Specifically, the offset current generating circuit 120 may generate the CTAT offset current by switching a first input terminal to which the temperature-variable voltage, such as the VNTC, is applied and a second input terminal to which the temperature-fixed voltage, such as the VZTC, is applied, when the offset current generating circuit 120 generates the PTAT offset current. For example, the offset current generating circuit 120 may include the first PMOS transistor and the second PMOS transistor, and the temperature-variable voltage, such as the VNTC, may be applied to a gate terminal of the second PMOS transistor and the temperature-fixed voltage, such as the VZTC, may be applied to a gate terminal of the first PMOS terminal in generating the CTAT offset current. Accordingly, the offset current generating circuit 120 may generate the CTAT offset current. That is, the offset current generating circuit 120 may control a direction of temperature compensation by selecting the input terminals to which temperature-variable voltage, such as the VNTC, and the temperature-fixed voltage, such as the VZTC, are applied, respectively.

In another example embodiment different from the offset current generating circuit 120 in FIG. 2A, an offset current generating circuit may receive a temperature-variable current, such as the INTC, and a temperature fixed current, such as the IZTC, from the current generator, instead of the temperature-variable voltage, such as the VNTC, and the temperature-fixed voltage, such as the VZTC, from a current generator. For example, the offset current generating circuit may include a first PMOS transistor and a second PMOS transistor, and the temperature-variable current, such as the INTC, may be applied to a drain terminal of the first PMOS transistor and the temperature fixed current, such as the IZTC, may be applied to a drain terminal of the second PMOS transistor. In such a configuration, a source terminal of the first PMOS transistor and a source terminal of the second PMOS transistor may be connected to each other. The offset current generating circuit may generate the offset current based on the temperature-variable current, such as the INTC, and the temperature-fixed current, such as the IZTC. The offset current generating circuit 120 may change the direction of temperature compensation by switching the input terminals of the temperature-variable current, such as the INTC, and the temperature-fixed current, such as the IZTC, with each other.

Figure 2B:
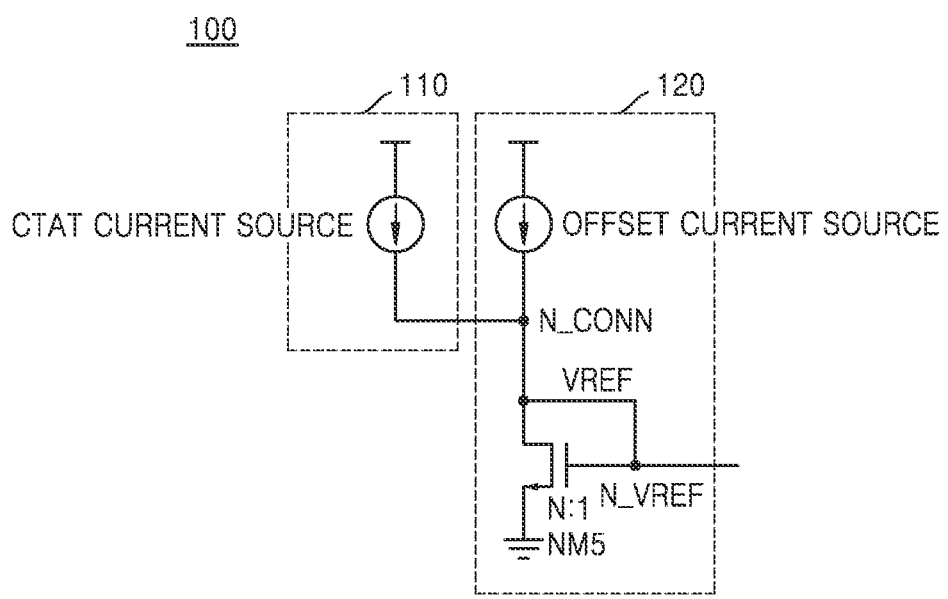
FIG. 2B is a circuit diagram showing a reference current generating circuit according to an example embodiment.

FIG. 2B is a circuit diagram showing the reference current generating circuit according to an example embodiment. FIG. 2B is described with reference to FIGS. 1A and 1B.

Referring to FIG. 2B, the reference current generating circuit 100 according to an example embodiment may include the CTAT current generating circuit 110 and the offset current generating circuit 120. The CTAT current generating circuit 110 may operate as a CTAT current source. The offset current generating circuit 120 may operate as an offset current source. The CTAT current generated by the CTAT current generating circuit 110 and the offset current generated by the offset current generating circuit 120 may be combined at a node N_CONN. The offset current generating circuit 120 may include the NMOS transistor NM5. The voltage at the node N_VREF may be the reference voltage VREF. The reference voltage VREF may be applied to the first and second operational amplifiers 210a and 210b of the clock signal generating circuit 200. The NMOS transistor NM5 may be a variable transistor. The NMOS transistor NM5 may include N transistors, and corresponding terminals of the N transistors may be connected to each other.

Figure 3:
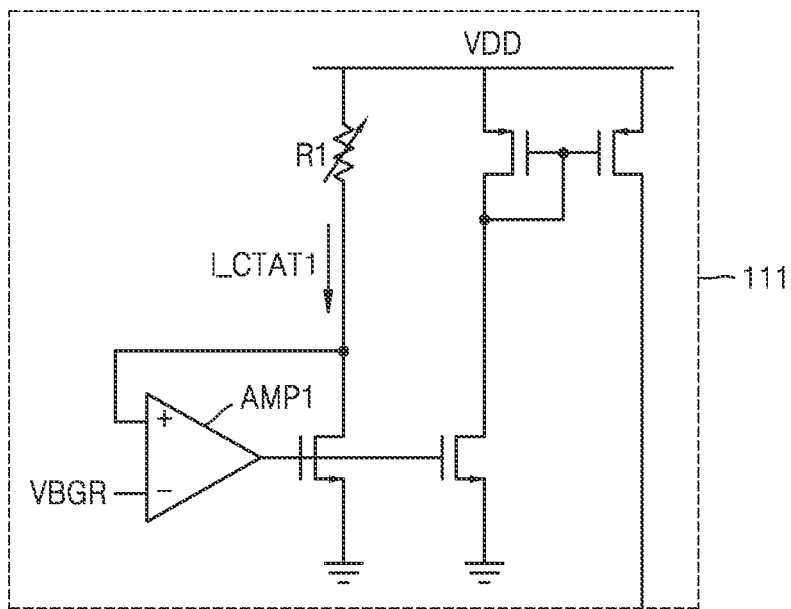
FIG. 3 is a circuit diagram showing a complementary to absolute temperature (CTAT) current generating circuit according to an example embodiment.
Figure 3:
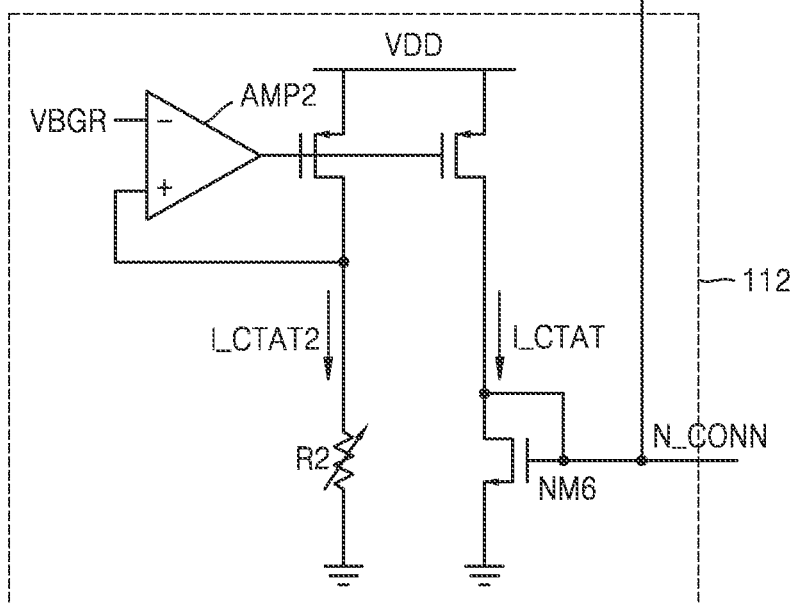

FIG. 3 is a circuit diagram showing a CTAT current generating circuit according to an example embodiment.

Referring to FIG. 3, the CTAT current generating circuit 110 according to an example embodiment may include the first curvature compensation circuit 111 and the second curvature compensation circuit 112. The first curvature compensation circuit 111 may include a resistor R1, an operational amplifier AMP1, a plurality of NMOS transistors, and a plurality of PMOS transistors. An input terminal of the operational amplifier AMP1 of the first curvature compensation circuit 111 may receive the bandgap reference voltage VBGR. The bandgap reference voltage VBGR may have a curvature characteristic. The first curvature compensation circuit 111 may generate the first current I_CTAT1. The first current I_CTAT1 may flow through the resistor R1. The first current I_CTAT1 may be expressed by Equation 2 below.

$$I\_CTAT1 = \frac{VDD - VBGR}{R1} \quad \text{[Equation 2]}$$

In Equation 2, VDD denotes a power voltage, which may correspond to a drain voltage of the plurality of PMOS transistors, VBGR denotes the bandgap reference voltage, and R1 denotes the resistance. The value of the resistor R1 may vary depending on the temperature.

The second curvature compensation circuit 112 may include a resistor R2, an operational amplifier AMP2, an NMOS transistor NM6, and a plurality of PMOS transistors. The second curvature compensation circuit 112 may generate the second current I_CTAT2. The second current I_CTAT2 may flow through the resistor R2. The second current I_CTAT2 may be expressed by Equation 3 below.

$$I\_CTAT2 = \frac{VBGR}{R2} \quad \text{[Equation 3]}$$

In Equation 3, R2 denote the resistance of the resistor R2, and VBGR denotes the bandgap reference voltage.

The first current I_CTAT1 and the second current I_CTAT2 may be added at a drain terminal of the NMOS transistor NM6, so that the CTAT current I_CTAT, which is the sum of the first current I_CTAT1 and the second current I_CTAT2, may be applied to the drain terminal of the NMOS transistor NM6. The first curvature compensation circuit 111 and the second curvature compensation circuit 112 may be connected to one another at the node N_CONN. The second curvature compensation circuit 112 may generate the CTAT current I_CTAT by adding the first current I_CTAT1 to the second current I_CTAT2, to thereby remove the curvature characteristic of the bandgap reference voltage VBGR. In addition, the second curvature compensation circuit 112 may generate the CTAT current I_CTAT by adding the first current I_CTAT1 to the second current I_CTAT2, to thereby reduce or remove the influence of the resistor distribution of the resistors R1 and R2 in the cycle of the clock signal.

Figure 4A:
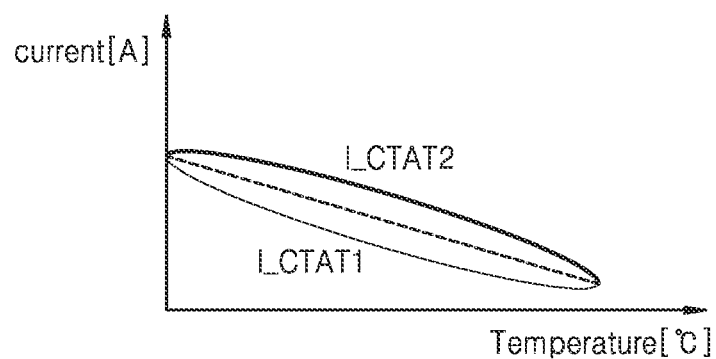
FIG. 4A is a current-temperature graph showing a first current and a second current with respect to temperature, according to an example embodiment.

FIG. 4A is a current-temperature graph showing the first current and the second current with respect to temperature, according to an example embodiment. FIG. 4A is described in detail with reference to FIG. 3.

Referring to FIG. 4A, the first current I_CTAT1 may have a curvature characteristic that is convex downward. The second current I_CTAT2 may have a convex curvature characteristic that is convex upward. In addition, the graph shows that the first current I_CTAT1 and the second current I_CTAT2 decreases as the temperature increases. Specifically, as the temperature of the first current I_CTAT1 increases, the rate of change of the current with respect to temperature may gradually increase. Because the rate of change of the first current I_CTAT1 with respect to temperature is negative, the magnitude of the rate of change of the first current I_CTAT1 with respect to temperature may gradually decrease as the temperature increases. In contrast, as the temperature increases, the rate of change of the second current I_CTAT2 with respect to temperature may gradually decrease. Because the rate of change of the second current I_CTAT2 with respect to temperature is negative, the magnitude of the rate of change of the second current I_CTAT2 with respect to temperature may gradually increase as the temperature increases.

Figure 4B:
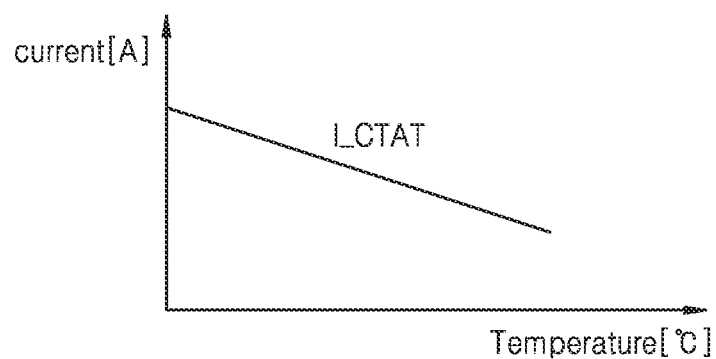
FIG. 4B is a current-temperature graph showing a CTAT current, which is generated by adding the first current and the second current, with respect to temperature, according to an example embodiment.

FIG. 4B is a current-temperature graph showing the CTAT current I_CTAT, which is generated by adding the first current to the second current, with respect to temperature, according to an example embodiment. FIG. 4B is described with reference to FIG. 3.

Referring to FIG. 4B, the CTAT current I_CTAT may be generated by adding the first current I_CTAT1 having the downwardly convex curvature characteristic to the second current I_CTAT2 having the upwardly convex curvature characteristic. The CTAT current I_CTAT may be linear and have no curvature, and thus, may decrease at a constant rate as the temperature increases.

Figure 5:
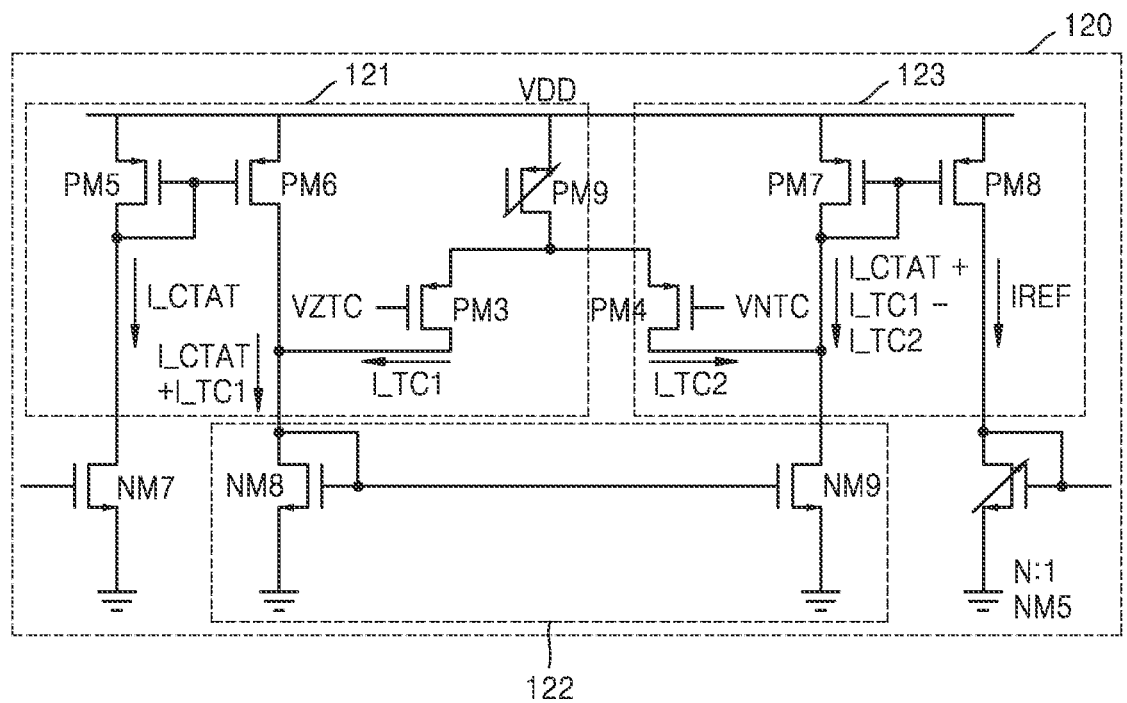
FIG. 5 is a circuit diagram showing an offset current generating circuit according to an example embodiment.

FIG. 5 is a circuit diagram showing an offset current generating circuit according to an example embodiment. FIG. 5 is described with reference to FIGS. 1A, 1B, and 3.

Referring to FIG. 5, the offset current generating circuit 120 may include a plurality of PMOS transistors PM3, PM4, PM5, PM6, PM7, and PM8 and a plurality of NMOS transistors NM5, NM7, NM8, and NM9. The offset current generating circuit 120 may include a first current mirror circuit 121, a second current mirror circuit 122, and a third current mirror circuit 123. The first current mirror circuit 121 may include a variable PMOS transistor PM9. The offset current generating circuit 120 may control the amount of the mirrored current. For example, the offset current generating circuit 120 may control the mirrored current by adjusting resistances of the transistors. In another example, the offset current generating circuit 120 may control the mirrored current by adjusting the number of transistors.

The CTAT current I_CTAT may be mirrored to a drain terminal of the NMOS transistor NM7. That is, the NMOS transistor NM7 may be configured in the current mirror together with the NMOS transistor NM6 of the CTAT current generating circuit 110. The temperature-fixed voltage, such as the VZTC, may be applied to a gate terminal of the PMOS transistor PM3. A first offset current I_TC1 may be output from a source terminal of the PMOS transistor PM3. The temperature-variable voltage, such as the VNTC, may be applied to a gate terminal of the PMOS transistor PM4. A second offset current I_TC2 may be output from a source terminal of the PMOS transistor PM4. The reference current IREF may be output from a drain terminal of the PMOS transistor PM7. The reference current IREF may be expressed as Equation 4 below.

$$IREF = I\_CTAT + I\_TC1 - I\_TC2 \quad \text{[Equation 4]}$$

The reference current IREF may be mirrored at a drain terminal of the PMOS transistor PM8. The reference current IREF may be mirrored in the clock signal generating circuit 200. The clock signal generating circuit 200 may generate the clock signal based on the reference current IREF. The NMOS transistor NM5 may be a variable transistor.

Figure 6:
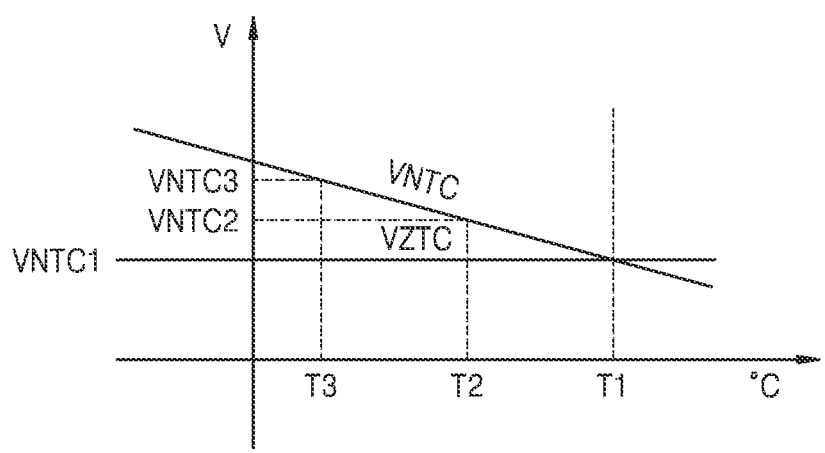
FIG. 6 is a voltage-temperature graph showing a temperature-fixed voltage and a temperature-variable voltage with respect to temperature, according to an example embodiment.

FIG. 6 is a voltage-temperature graph showing the VNTC and the VZTC with respect to temperature, according to an example embodiment.

In FIG. 6, the horizontal axis of the graph represents temperature, and the vertical axis of the graph represents voltage. The temperature-variable voltage (voltage negative temperature (VNTC)) may indicate a voltage that changes with temperature. The temperature-fixed voltage (voltage zero temperature coefficient (VZTC)) may indicate a voltage that does not change with temperature. In an example embodiment, the VNTC and the VZTC may be generated from the same voltage generator. Otherwise, the VNTC and the VZTC may be generated from different voltage generators depending on example embodiments.

Referring to FIG. 6, the VNTC decreases linearly as the temperature increases, and the VZTC is constant as the temperature increases or decreases.

A first temperature T1 may be higher than a second temperature T2, and the second temperature T2 may be higher than a third temperature T3. In addition, the VNTC corresponding to the first temperature T1 is VNTC1, corresponding to the second temperature T2 is VNTC2, and corresponding to the third temperature T3 is VNTC3. The VNTC and the VZTC may have the same value at the first temperature T1, so that the VZTC corresponding to the first temperature T1 is also VNTC1. The voltage level of the VNTC may decrease (VNTC3->VNTC2->VNTC1), as the temperature increases (T3->T2->T1). The voltage level of the VZTC may be constant as the temperature increases.

Furthermore, the temperature-variable current, such as the INTC, may be a current having the same characteristics as the temperature-variable voltage, such as the VNTC, described above. In addition, the temperature-fixed current, such as the IZTC, may be a current having the same characteristics as the temperature-fixed voltage, such as the VZTC.

Figure 7A:
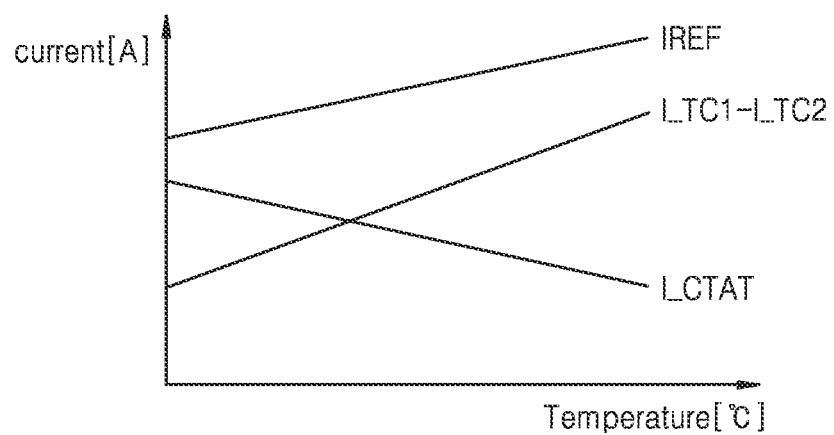
FIG. 7A is a current-temperature graph when the offset current is a proportional to absolute temperature (PTAT) current, according to an example embodiment.

FIG. 7A is a current-temperature graph when the offset current is a PTAT current, according to an example embodiment. FIG. 7A is described with reference to FIGS. 1A, 1B, 3, and 5.

Referring to FIG. 7A, the CTAT current generation circuit 110 may generate the CTAT current I_CTAT. The offset current generating circuit 120 may generate a first offset current I_TC1 and a second offset current I_TC2. The offset current generating circuit 120 may generate an offset current corresponding to the difference between the first offset current I_TC1 and the second offset current I_TC2. Referring to FIG. 7A, the offset current may be a PTAT current that increases with temperature. The offset current generating circuit 120 may generate the reference current IREF by adding the CTAT current I_CTAT to the offset current. The offset current generating circuit 120 may adjust the first offset current I_TC1 and the second offset current I_TC2, to thereby control the offset current. Thus, the offset current generating circuit 120 may generate a linearly increasing reference current IREF that is uniformly increased with temperature, by controlling the offset current.

In some example embodiments, the offset current generating circuit 120 may generate a constant reference current IREF that is constant with changes in temperature by controlling the offset current. That is, the offset current generating circuit 120 may generate the reference current IREF that does not change with temperature by adding the CTAT current I_CTAT to the complementary offset current.

Figure 7B:
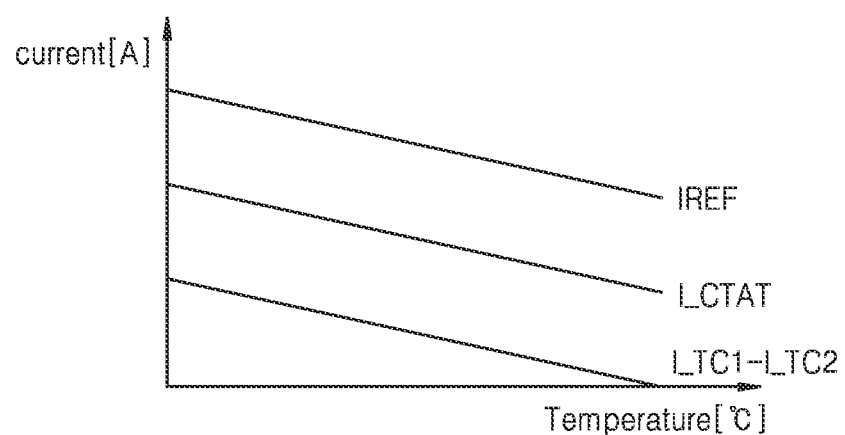
FIG. 7B is a current-temperature graph when the offset current is a CTAT current, according to an example embodiment.

FIG. 7B is a current-temperature graph when the offset current is a CTAT current, according to an example embodiment. FIG. 7B is described with reference to FIGS. 1A, 1B, 3, and 5.

Referring to FIG. 7B, the CTAT current generation circuit 110 may generate a CTAT current I_CTAT. The offset current generating circuit 120 may generate a first offset current I_TC1 and a second offset current I_TC2. The offset current generating circuit 120 may generate an offset current corresponding to the difference between the first offset current I_TC1 and the second offset current I_TC2. As shown in FIG. 7B, the offset current may be a CTAT current that decreases with temperature. The offset current generating circuit 120 may generate a reference current IREF by adding the CTAT current I_CTAT to the offset current. The offset current generating circuit 120 may adjust the first offset current I_TC1 and the second offset current I_TC2, to thereby control the offset current. The offset current generating circuit 120 may generate a linearly decreasing reference current IREF that uniformly decreases with temperature, by controlling the offset current.

Figure 8:
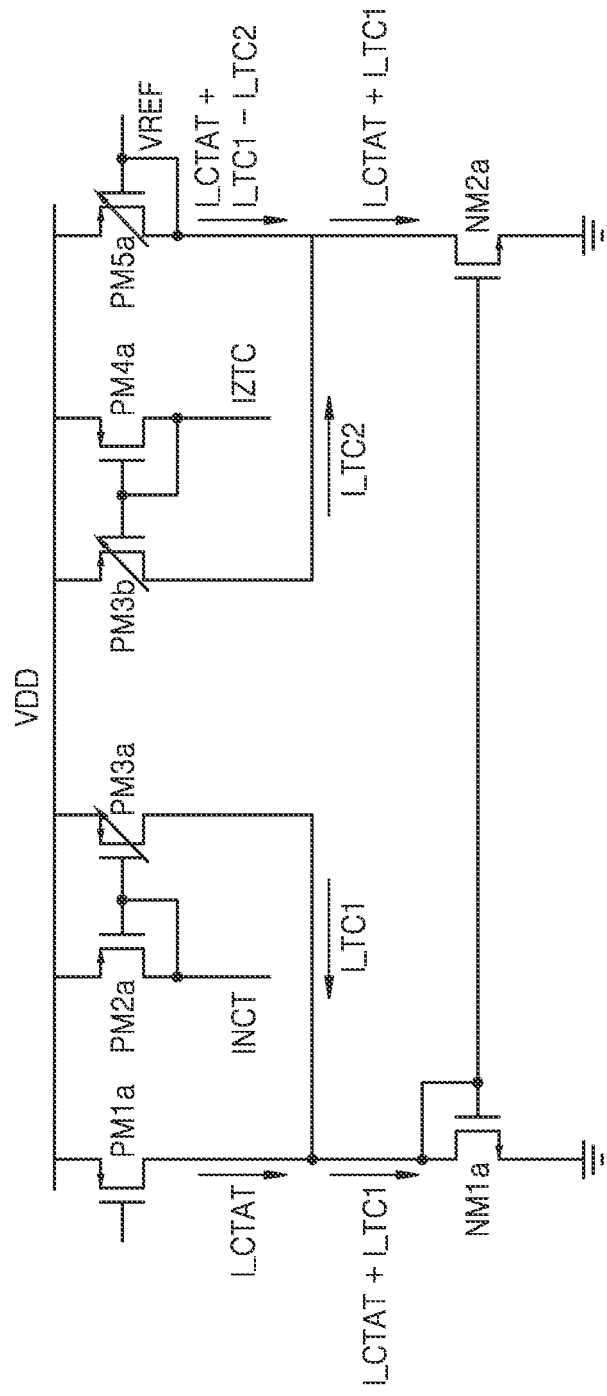
FIG. 8 is a circuit diagram showing an offset current generating circuit according to an example embodiment.

FIG. 8 a circuit diagram showing an offset current generating circuit according to an example embodiment. FIG. 8 is described with reference to FIG. 3.

Referring to FIG. 8, the offset current generating circuit 120 may include a plurality of PMOS transistors PM1a, PM2a, PM3a, PM3b, PM4a, and PM5a and a plurality of NMOS transistors NM1a and NM2a. The PMOS transistors PM3a, PM3b, and PM5a may be variable transistors.

The CTAT current I_CTAT may be mirrored to the drain terminal of the PMOS transistor PM2a. That is, the NMOS transistor NM1a may be configured in a current mirror together with the NMOS transistor NM6 of the CTAT current generation circuit 110.

The temperature-variable current, such as the INTC, may flow to a drain terminal of the PMOS transistor PM2a. The first offset current I_TC1 may be output from a drain terminal of the PMOS transistor PM3a. The temperature-fixed current, such as the INTC, may flow to a drain terminal of the PMOS transistor PM4a. The second offset current I_TC2 may be output from a drain terminal of the PMOS transistor PM3b. The reference current IREF may be output from a drain terminal of the PMOS transistor PM5a. The reference current IREF may be expressed as Equation 5 below.

$$IREF = I\_CTAT + I\_TC1 - I\_TC2 \qquad \text{[Equation 5]}$$

The reference current IREF may be mirrored in the clock signal generating circuit 200. The clock signal generating circuit 200 may generate a clock signal based on the reference current IREF.

Figure 9:
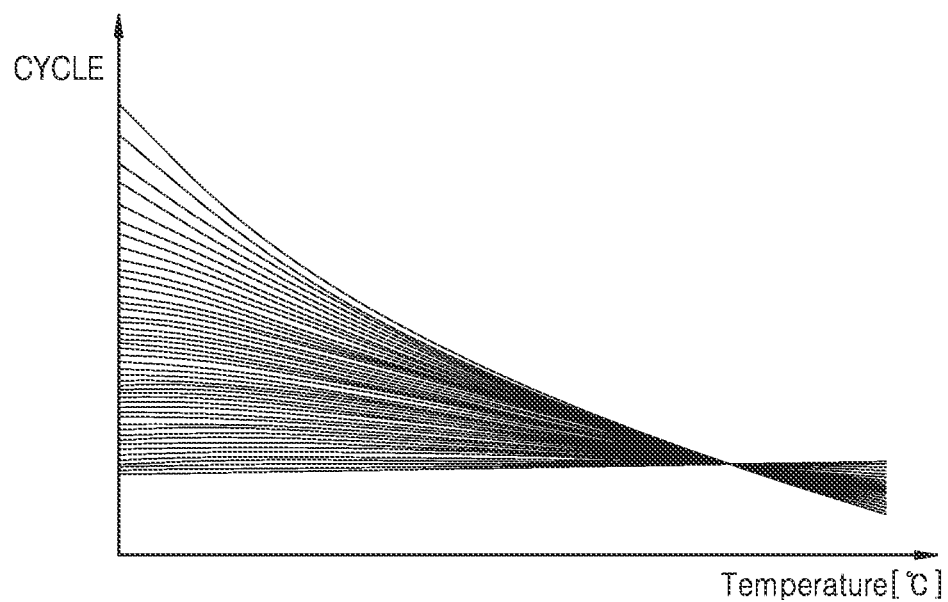
FIG. 9 is a cycle-temperature graph showing the relationship between temperature and a cycle of clock signals generated by a clock signal generator, according to an example embodiment.

FIG. 9 is a cycle-temperature graph showing the relationship between temperature and a cycle of the clock signals generated by a clock signal generator, according to an example embodiment. FIG. 9 is described with reference to FIGS. 1A, 1B, 3, and 5.

FIG. 9 shows a distribution of the cycles of the clock signals with respect to temperature. The clock signal generator 10 according to an example embodiment may generate the clock signals based on the reference current IREF generated by the reference current generating circuit 100. The cycle of the clock signals generated by the clock signal generator 10 may be determined based on the reference current IREF generated by the reference current generating circuit 100.

The reference current IREF may be constant with respect to temperature. Accordingly, the clock signal generator 10 may generate a clock signal having a constant clock cycle with temperature. In addition, the clock signal generator 10 may increase or decrease the reference current IREF at a constant rate with temperature for temperature compensation. Accordingly, the clock signal generator 10 may generate clock signals having a linear-variable clock cycle with temperature, and the clock signal generator 10 may compensate for the temperature even in environments with large temperature variations. In addition, the clock signal generator 10 may determine the direction of the temperature compensation by a selection signal.

Figure 10:
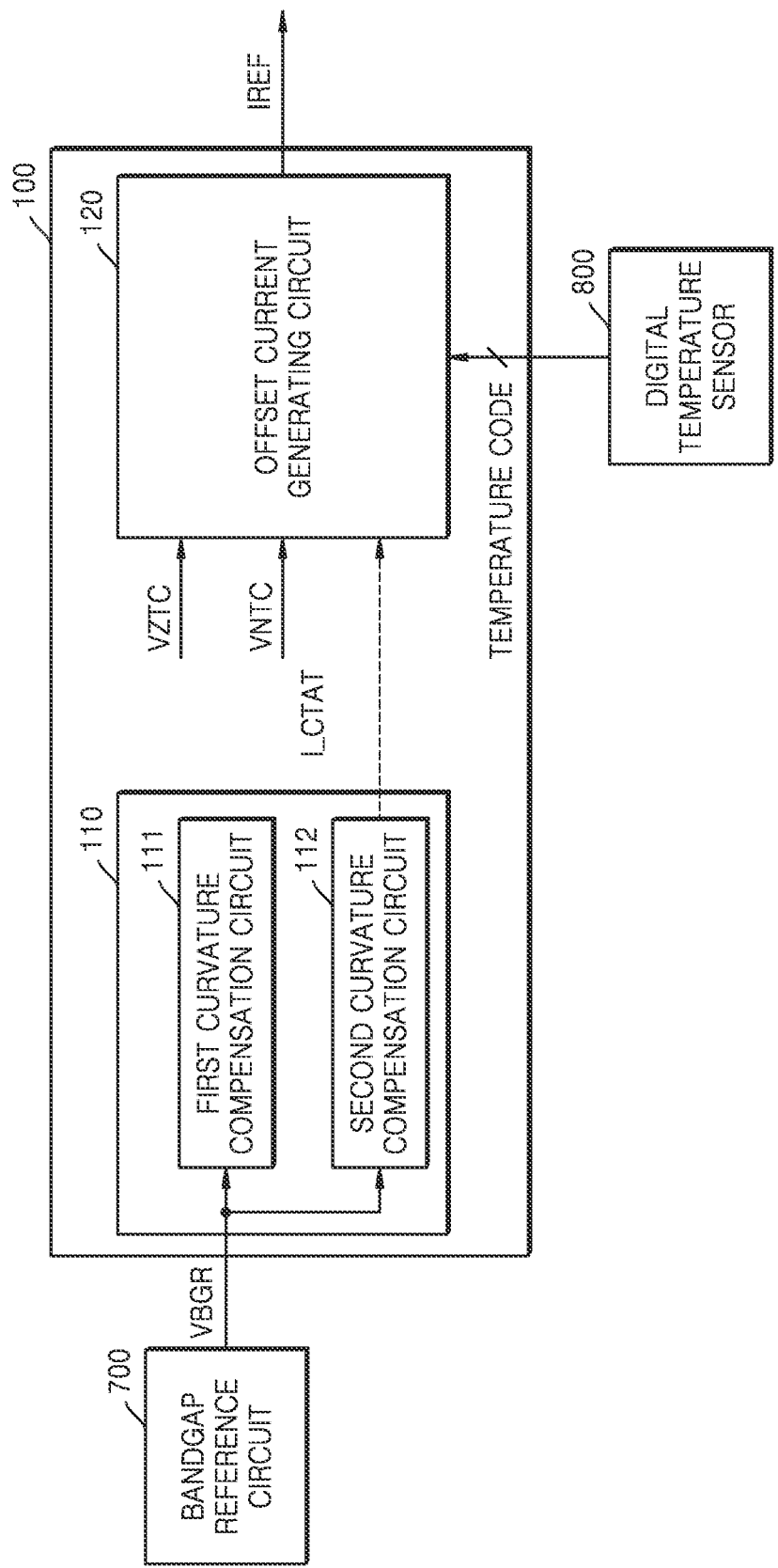
FIG. 10 is a block diagram showing a reference current generating circuit according to another example embodiment.

FIG. 10 is a block diagram showing a reference current generating circuit according to another example embodiment. FIG. 10 will be described with reference to FIGS. 2A and 5, and duplicate descriptions are omitted.

Referring to FIG. 10, a reference current generating circuit 100 according to another example embodiment may include the CTAT current generating circuit 110 and the offset current generating circuit 120. The CTAT current generation circuit 110 may include the first curvature compensation circuit 111 and the second curvature compensation circuit 112. The first curvature compensation circuit 111 and the second curvature compensation circuit 112 may receive the bandgap reference voltage VBGR from the bandgap reference circuit 700. The first curvature compensation circuit 111 may generate a first current based on the bandgap reference voltage VBGR. The second curvature compensation circuit 112 may generate a second current based on the bandgap reference voltage VBGR. The second curvature compensation circuit 112 may generate a CTAT current I_CTAT having no curvature characteristic by adding the first current to the second current. The second curvature compensation circuit 112 may provide the CTAT current I_CTAT to the offset current generating circuit 120. For example, the offset current generating circuit 120 may mirror the CTAT current I_CTAT by the current mirror.

The offset current generating circuit 120 may receive the temperature-fixed voltage, such as VZTC, and the temperature-variable voltage, such as the VNTC, from a voltage generator. For example, the offset current generating circuit 120 may include a first PMOS transistor and a second PMOS transistor, and the VNTC may be applied to a gate terminal of the first PMOS transistor and the VZTC may be applied to a gate terminal of the second PMOS transistor. A source terminal of the first PMOS transistor and a source terminal of the second PMOS transistor may be connected to each other. The offset current generating circuit 120 may generate the offset current based on the temperature-variable voltage, such as the VNTC, and the temperature-fixed voltage, such as the VZTC. For example, the offset current may be a PTAT current. In another example, the offset current may be a CTAT current. The offset current generating circuit 120 may generate the reference current IREF by adding the generated offset current to the CTAT current I_CTAT. For example, when the offset current is the PTAT current, the reference current IREF also may be an increasing (PTAT) current that increases with temperature. In another example, when the offset current is the PTAT current, the reference current IREF may also be a constant current that is constant with changes in temperature. That is, the CTAT current I_CTAT and the offset current, which are added together, may be complementary to each other. In another example, when the offset current is the CTAT current, the reference current IREF may be a decreasing (CTAT) current that decreases with temperature.

The offset current generating circuit 120 may receive a temperature code from a digital temperature sensor 800. The offset current generating circuit 120 may control the amount of current that is mirrored by the current mirror based on the temperature code. For example, the offset current generating circuit 120 in FIG. 5 may control the PMOS transistor PM3 based on the temperature code. The offset current generating circuit 120 may control the first offset current I_TC1 and the second offset current I_TC2 based on the temperature-variable voltage, such as the VNTC, the temperature-fixed voltage, such as the VZTC, and the temperature code.

In another example embodiment, the temperature-variable current, such as the INTC, and the temperature-fixed current, such as the IZTC, may be provided instead of the temperature-variable voltage, such as the VNTC, and the temperature-fixed voltage, such as the VZTC. For example, the offset current generating circuit may include a first PMOS transistor and a second PMOS transistor, and the temperature-variable current, such as the INTC, may be applied to a gate terminal of the first PMOS transistor and the temperature-fixed current, such as the IZTC, may be applied to a gate terminal of the second PMOS transistor. A source terminal of the first PMOS transistor and a source terminal of the second PMOS transistor may be connected to each other. The offset current generating circuit 120 may generate an offset current based on the temperature-variable current, such as the INTC, and the temperature-fixed current, such as the IZTC.

Figure 11:
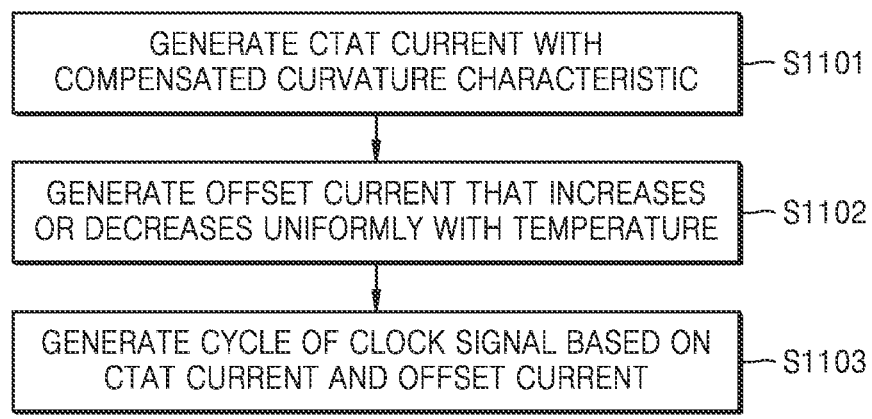
FIG. 11 is a flowchart showing an operation procedure of a clock signal generator, according to an example embodiment.

FIG. 11 is a flowchart showing an operation procedure of the clock signal generator, according to an example embodiment. FIG. 11 will be described with reference to FIGS. 1A, 1B, 2A, and 8.

Referring to FIG. 11, in operation S1101, the clock signal generator 10 may generate the CTAT current I_CTAT with compensated curvature characteristic. For example, the clock signal generator 10 may receive the bandgap reference voltage VBGR from the bandgap reference circuit 700. The clock signal generator 10 may generate a first current having a first curvature characteristic based on the bandgap reference voltage VBGR and a second current having a second curvature characteristic based on the bandgap reference voltage VBGR. The clock signal generator 10 may generate the CTAT current I_CTAT by adding the first current to the second current. The first current may be a CTAT current that is convex downward on the current-temperature graph. The second current may be a convex CTAT current that is convex upward on the current-temperature graph.

In operation S1102, the clock signal generator 10 may generate the offset current that increases or decreases uniformly with temperature.

For example, the clock signal generator 10 may receive the temperature-variable voltage, such as the VNTC, at the gate terminal of the first PMOS transistor and the temperature-fixed voltage, such as the VZTC, at the gate terminal of the second POS transistor. In addition, the clock signal generator 10 may generate the offset current based on the temperature-variable voltage, such as the VNTC, and the temperature-fixed voltage, such as the VZTC. A source terminal of the first PMOS transistor and a source terminal of the second PMOS transistor may be connected to each other.

In another example embodiment, the clock signal generator 10 may receive a temperature-variable current, such as the INTC, at the gate terminal of the first PMOS transistor and the temperature-fixed current, such as the IZTC, at the gate terminal of the second POS transistor, from the current generator. In addition, the offset current may be generated based on the temperature-fixed current, such as the IZTC, and the temperature-variable current, such as the INTC. The source terminal of the first PMOS transistor and the source terminal of the second PMOS transistor may be connected to each other.

In operation S1103, the clock signal generator 10 may generate the cycle of the clock signals based on the CATA current I_CTAT and the offset current. For example, the clock signal generator 10 may generate the reference current IREF by adding the CTAT current I_CTAT to the offset current. The clock signal generator 10 may alternately discharge the first capacitor and the second capacitor based on the reference current IREF and individually charge the first capacitor and the second capacitor based on the power voltage VDD, to thereby generate the clock signal.

FIG. 12 is a block diagram showing a non-volatile memory device according to an example embodiment. FIG. 12 will be described with reference to FIG. 1A.

Referring to FIG. 12, a non-volatile memory device 900 according to an example embodiment may include a memory cell array 910, a control logic 920, a voltage generator 930, a row decoder 940, and a page buffer 950. The non-volatile memory device 900 may further include a data input/output circuit or an input/output interface. In addition, the non-volatile memory device 900 may further include a column logic, a pre-decoder, a temperature sensor, a command decoder, an address decoder, and the like.

The memory cell array 910 may be connected to the page buffer 150 through bit lines BL and may be connected to the row decoder 940 through word lines WL, string selection lines SSL, and ground selection lines GSL. The memory cell array 910 may include a plurality of memory cells such as flash memory cells. Hereinafter, example embodiments are described with reference to a case where the plurality of memory cells are NAND flash memory cells. However, the plurality of memory cells are not limited to NAND flash memory cells, and in some example embodiments, the plurality of memory cells may include resistive memory cells such as resistive RAM (ReRAM) memory cells, phase change RAM (PRAM) memory cells, and magnetic RAM (MRAM) memory cells.

An oscillator 921 (e.g., an oscillator circuit) may correspond to the clock signal generator 10 according to an example embodiment. The oscillator 921 may generate a clock signal having a certain cycle. The control logic 920 may access the memory cell array 910 based on a clock signal generated by the oscillator 921.

In an example embodiment, the memory cell array 910 may include a three-dimensional memory cell array having a plurality of NAND strings where each NAND string may include a plurality of memory cells connected to word lines, respectively, which are stacked vertically on a substrate, as described hereinafter with reference to FIGS. 12 to 14. However, example embodiments are not limited to a three-dimensional memory cell array, and thus, in some example embodiments, the memory cell array 910 may include a two-dimensional memory cell array having a plurality of NAND strings that are arranged in row and column directions.

Figure 13:
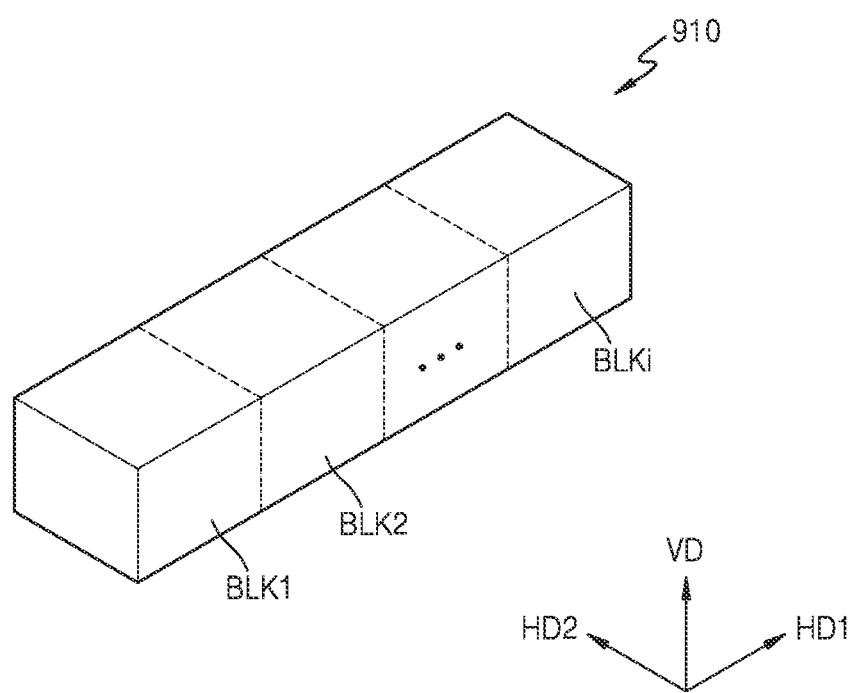
FIG. 13 is a perspective view illustrating a memory cell array according to an example embodiment.

FIG. 13 is a perspective view illustrating a memory cell array according to an example embodiment. FIG. 13 will be described with reference to FIG. 12.

Referring to FIG. 13, the memory cell array 910 may include a plurality of memory blocks BLK1 to BLKi (i is a positive integer). Each of the memory blocks BLK1 to BLKi may be configured in a three-dimensional structure (or to a vertical structure). Specifically, each of the memory blocks BLK1 to BLKi may include a plurality of NAND strings extending in a vertical direction VD. In this case, the plurality of NAND strings may be arranged in such a configuration that the NAND strings are spaced apart from each other by a specific distance in a first horizontal direction HD1 and a second horizontal direction HD2. The row decoder 940 may select at least one of the plurality of memory blocks BLK1 to BLKi. For example, the row decoder 940 may select a particular memory block corresponding to a block address from the plurality of memory blocks BLK1 to BLKi.

Figure 14:
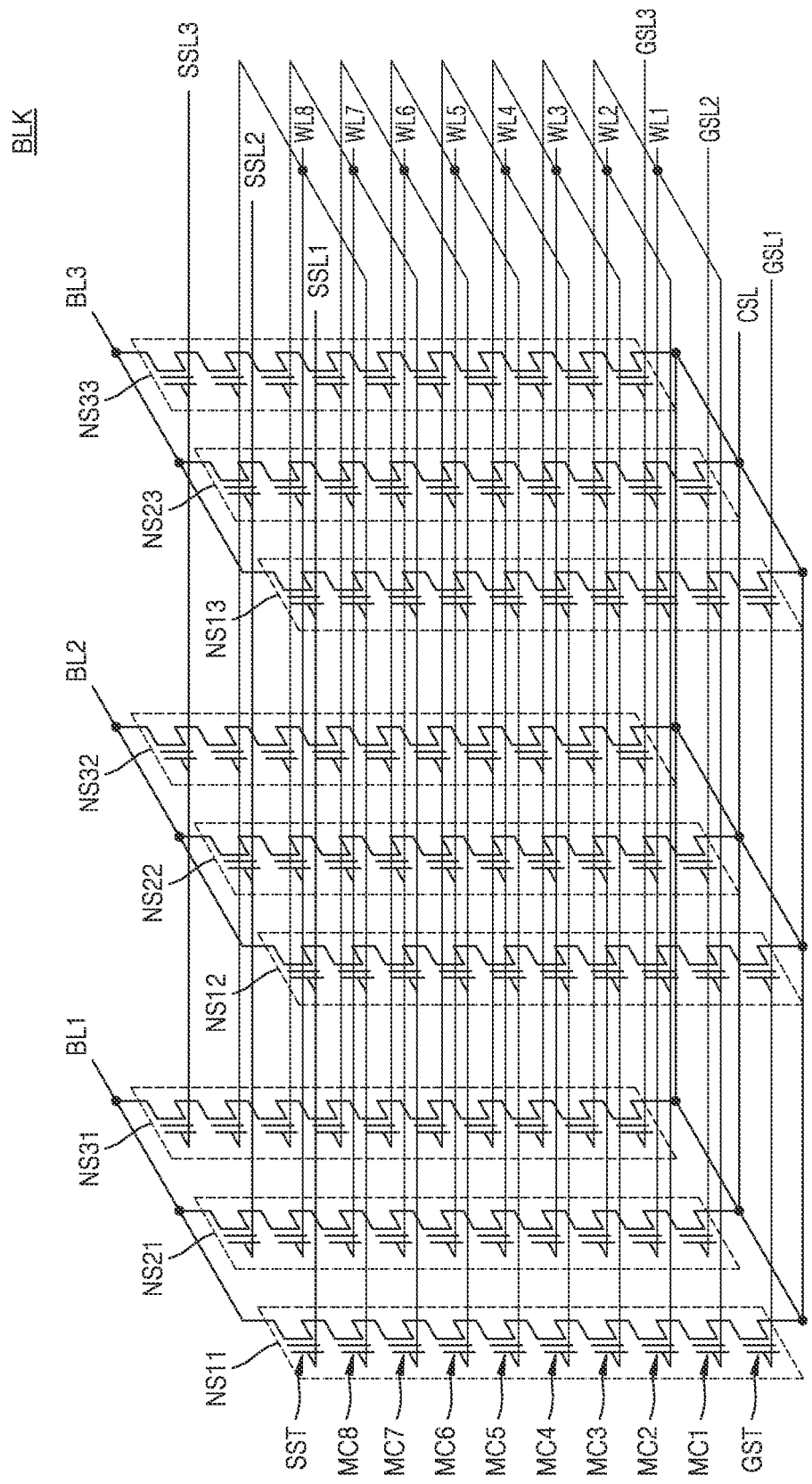
FIG. 14 is a circuit diagram showing an equivalent circuit of a memory block according to an example embodiment.

FIG. 14 is a circuit diagram showing an equivalent circuit of a memory block BLK according to an example embodiment.

For example, the memory block BLK may correspond to one of the plurality of memory blocks BLK1 to BLKi in FIG. 13.

Referring to FIG. 14, the memory block BLK may include a plurality of NAND strings NS11 to NS33, a plurality of word lines WL1 to WL8, a plurality of bit lines BL1 to BL3, a plurality of ground selection lines GSL1 to GSL3, and a common source line CSL. Herein, the number of NAND strings, the number of word lines, the number of bit lines, the number of ground selection lines, and the number of string selection lines may be variously changed depending on example embodiments.

The NAND strings NS11, NS21, and NS31 may be arranged between the first bit line BL1 and the common source line CSL, the NAND strings NS12, NS22, and NS32 may be arranged between the second bit line BL2 and the common source line CSL, and the NAND strings NS13, NS23, NS33 may be arranged between the third bit line BL3 and the common source line CSL. Each NAND string, for example, first NAND string NS11, may include a string selection transistor SST, a plurality of memory cells MC1 to MC8, and a ground selection transistor GST that are connected in series.

The string selection transistor SST may be connected to a corresponding string selection line among the string selection lines SSL1 to SSL3. A plurality of memory cells MC1 to MC8 may be connected to the word lines WL1 to WL8, respectively. The ground selection transistor GST may be connected to corresponding ground selection line among the ground selection lines GSL1 to GSL3. The string selection transistor SST may be connected to the corresponding bit line among the bit lines BL1 to BL3, and the ground selection transistor GST may be connected to the common source line CSL.

In an example embodiment, a plurality of word lines having the same height (e.g., WL1) may be commonly connected to each other, while the string selection lines SSL1 to SSL3 are separated from each other and the ground selection lines GSL1 to GSL3 are also separated from each other. In FIG. 14, three string selection lines SSL1 to SSL3 are illustrated in such a configuration that the plurality of word lines having the same height are shared with a single string selection line, but example embodiments are not limited thereto. For example, the plurality of word lines having the same height may be shared with two string selection lines. In another example, the plurality of word lines having the same height may be shared with four string selection lines.

Figure 15:
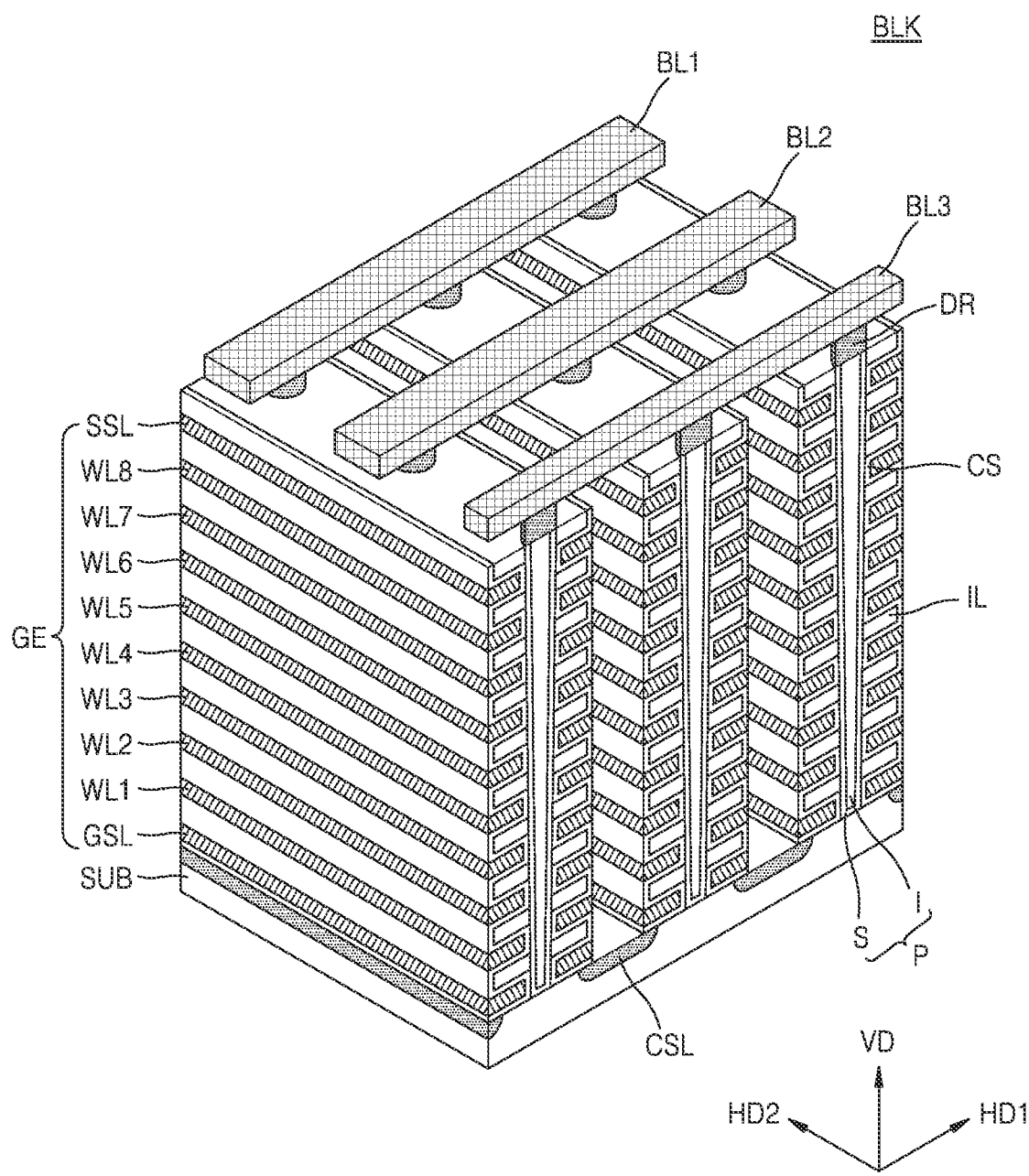
FIG. 15 is a perspective view illustrating the memory block shown in FIG. 14.

FIG. 15 is a perspective view illustrating the memory block BLK shown in FIG. 14. FIG. 15 will be described with reference to FIG. 1. 12.

Referring to FIG. 15, the memory block BLK may extend in the vertical direction VD perpendicular to the substrate SUB. The substrate SUB may have a first conductivity type (e.g., p type) and the common source line CSL doped with impurities of a second conductivity type (e.g., n type) may extend in the second horizontal direction HD2 on the substrate SUB. A plurality of insulating layers IL, which are sequentially arranged at a specific distance in the vertical direction VD, may extend in the second horizontal direction HD2 on the substrate SUB between a pair of common source lines CSL adjacent to each other. For example, the insulating layer IL may include an insulating material such as silicon oxide.

A plurality of pillars P, which penetrates through the plurality of insulating layers IL in the vertical direction VD, may be arranged in the substrate SUB between the pair of common source lines CSL adjacent to each other, and thus, the plurality of pillars P may be sequentially arranged in the first horizontal direction HD1. For example, the plurality of pillars P may penetrate through the plurality of insulating layers IL to contact the substrate SUB. In an example embodiment, a surface layer S of each pillar P may include a silicon-based conductive material having a first conductive type and function as a channel area. In contrast, an inner layer I of each pillar P may include an insulating material such as silicon oxide and an air gap.

A charge storage layer CS may be provided along exposed surfaces of the insulating layers IL, the pillars P, and the substrate SUB in the area between the pair of common source lines CSL adjacent to each other. The charge storage layer CS may include a gate insulating layer (or referred to as a "tunneling insulating layer"), a charge trap layer, and a blocking insulating layer. For example, the charge storage layer CS may have an oxide-nitride-oxide (ONO) structure.

In addition, a plurality of gate electrodes GE of the selection lines GSL and SSL and the word lines WL1 to WL8 may be provided on the exposed surface of the charge storage layer CS in the area between the pair of common source lines CSL adjacent to each other.

A plurality of drains or drain contacts DR may be provided on the plurality of pillars P, respectively. For example, the drains or the drain contacts DR may include a silicon material doped with impurities having a second conductivity type. A plurality of bit lines BL1 to BL3, which extend in the first horizontal direction HD1 and are spaced apart by a specific distance in the second horizontal direction HD2, are provided on the drain contacts DR.

Figure 16:
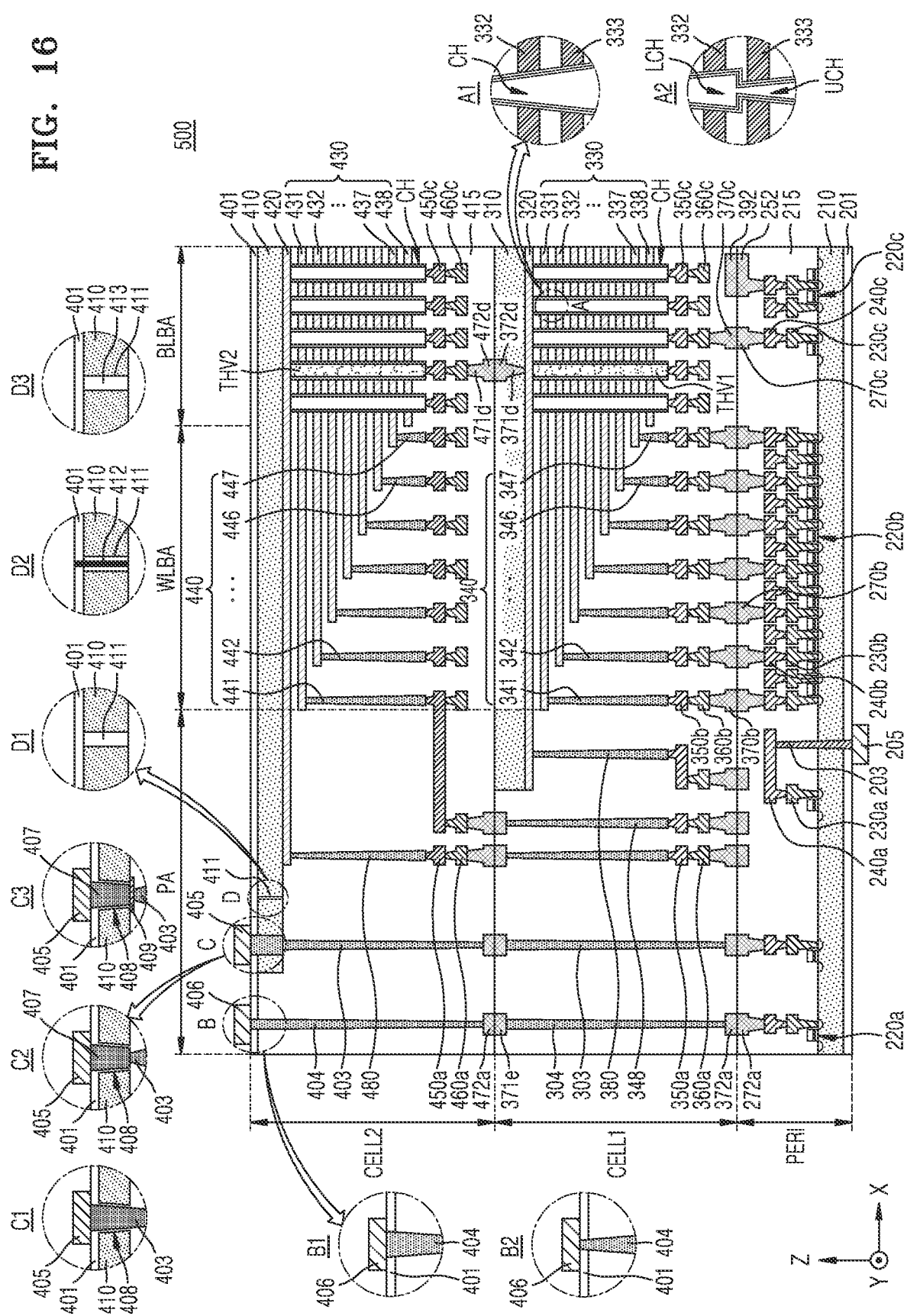
FIG. 16 is a cross-sectional view illustrating a memory device having a B-VNAND structure, according to an example embodiment.

FIG. 16 is a cross-sectional view illustrating a memory device having a B-VNAND structure, according to an example embodiment.

Referring to FIG. 16, a memory device 500 according to an example embodiment may have a chip to chip (C2C) structure. Herein, the C2C structure indicates a chip bonding structure in which an upper chip having a cell region CELL and a lower chip having a peripheral circuit region PERI, which are manufactured individually by separated processes, are connected to each other by a bonding process. For example, a first bonding metal pattern on an uppermost metal layer of the upper chip may be electrically and physically connected to a second bonding metal pattern on an uppermost metal layer of the lower chip by the bonding process. For example, when the first and second bonding metal patterns include copper (Cu), the bonding process may be referred to as copper (Cu) to copper (Cu) bonding process. In another example, the first and second bonding metal patterns may include aluminum (Al) and tungsten (W).

The memory device 500 may include at least one upper chip having the cell region CELL. For example, as shown in FIG. 16, the memory device 500 may include two upper chips having two cell regions CELL1 and CELL2. However, those configurations are disclosed for an example, and the number of upper chips is not limited thereto. When implemented to include two upper chips, the memory device 500 may be manufactured by the bonding process in which a first upper chip having a first cell region CELL1, a second upper chip having a second cell region CELL2, and a lower chip having a peripheral circuit region PERI, which are manufactured individually by separated processes, are connected to each other. The first upper chip may be turned over and be bonded to the lower chip by the bonding process and the second upper chip may be turned over and be bonded to the first upper chip by the bonding process. Herein, the terms 'upper portion' and 'lower portion' are defined in a state that the first upper chip and the second upper chip are not turned over. That is, in a view of FIG. 16, the upper portion of the lower chip indicates a portion on or over the lower chip in +Z direction and the upper portion of the first and second upper chips indicates under or below the first and second upper chips in −Z direction. However, those configurations are disclosed for an example, and one of the first upper chip and the second upper chip may be turned over and bonded by the bonding process.

Each of the peripheral circuit area PERI, the first cell region CELL1, and the second cell region CELL2 of the memory device 500 may include an external pad bonding area PA, a word line bonding area WLBA, and a bit line bonding area BLBA.

The peripheral circuit area PERI may include a first substrate 210 and a plurality of circuit devices 220a, 220b, and 220c that are arranged on the first substrate 210. An interlayer insulating layer 215 including one or more insulating layers may be provided on the plurality of circuit devices 220a, 220b, and 220c, and a plurality of metal wires for connecting the circuit devices 220a, 220b, and 220c may be provided in the interlayer insulating layer 215. For example, the plurality of metal wirings may include first metal wirings 230a, 230b, 230c connected to the plurality of circuit devices 220a, 220b, and 220c, respectively, and second metal wirings 240a, 240b, and 240c that are arranged on the first metal wirings 230a, 230b, and 230c. The plurality of metal wirings may include at least one of various conductive materials. For example, the first metal wirings 230a, 230b, and 230c may include tungsten (W) having relatively high electrical resistivity, and the second metal wirings 240a, 240b, and 240c may include copper (CU) having relatively low electrical resistivity.

Although only the first metal wirings 230a, 230b, and 230c and the second metal wirings 240a, 240b, and 240c are illustrated and described herein, the configurations of the metal wirings are not limited thereto and at least one additional metal wiring may be further provided on the second metal wirings 240a, 240b, and 240c. In this case, the second metal wires 240a, 240b, and 240c may include aluminum (Al). In addition, at least a portion of the additional metal wiring, which is arranged on the second metal wirings 240a, 240b and 240c, may include copper (Cu) having a lower electrical resistivity than aluminum (Al) of the second metal wirings 240a, 240b, and 240c.

The interlayer insulating layer 215 may be arranged on the first substrate 210 and may include an insulating material such as silicon oxide and silicon nitride.

Each of the first and second cell regions CELL1 and CELL2 may include at least one memory block. The first cell region CELL1 may include a second substrate 310 and a common source line 320 on the second substrate 310. A plurality of word lines 330 or 331 to 338 may be arranged on the second substrate 310 and be stacked in a direction perpendicular to an upper surface of the second substrate 310 (Z-axis direction). A plurality of string selection lines and a plurality of ground selection lines may be arranged above and below the word lines 330, and thus, the plurality of word lines 330 may be arranged between the string selection lines and the ground selection lines. Similarly, the second cell region CELL2 may include a third substrate 410 and a common source line 420 on the third substrate 410, and a plurality of word lines 430 or 431 to 438 may be arranged on the third substrate 410 and stacked in a direction perpendicular to an upper surface of the third substrate 410 (Z-axis direction). The second substrate 310 and the third substrate 410 may include various materials, such as a silicon substrate, a silicon-germanium substrate, a germanium substrate, and a substrate with a monocrystalline epitaxial layer grown on a monocrystalline silicon substrate. A plurality of channel structures CH may be provided in each of the first and second cell regions CELL1 and CELL2.

In an example embodiment, as shown in detail in an enlarged view of a portion A1 of FIG. 16, the channel structure CH may be provided in the bit line bonding area BLBA and may extend in the direction perpendicular to the upper surface of the second substrate 310 to penetrate through the word lines 330, the string selection lines, and the ground selection lines. The channel structure CH may include a data storage layer, a channel layer, and a buried insulating layer. The channel layer may be electrically connected to the first metal wiring 350c and the second metal wiring 360c in the bit line bonding area BLBA. For example, the second metal wiring 360c may be the bit line and may be connected to the channel structure CH via the first metal wiring 350c. The bit line 360c may extend in a first direction (Y-axis direction) parallel to the upper surface of the second substrate 310.

In one example embodiment, as shown in detail in an enlarged view A2, the channel structure CH may include a lower channel LCH and an upper channel UCH connected with each other. For example, the channel structure CH may be obtained by a lower process for forming the lower channel LCH and an upper process for forming the upper channel UCH. The lower channel LCH may extend in a direction perpendicular to the upper surface of the second substrate 310 to penetrate through the common source line 320 and lower word lines 331 and 332. The lower channel LCH may include a data storage layer, a channel layer, a buried insulating layer, and may be connected to the upper channel UCH. The upper channel UCH may penetrate through upper word lines 333 to 338. The upper channel UCH may include a data storage layer, a channel layer, and a buried insulating layer, and the channel layer of the upper channel UCH may be electrically connected to the first metal wiring 350c and the second metal wiring 360c. As the length of the channel structure CH increases, the channel structure CH may have difficulties in forming a uniform channel width due to the process requirements. The memory device 500 according to an example embodiment may have the channel structure CH of which the channel width is sufficiently improved by sequential formation of the lower channel LCH and the upper channel UCH.

When the channel structure CH includes the lower channel LCH and the upper channel UCH as shown in enlarged view A2, at least one word line near the boundary area between the lower channel LCH and the upper channel UCH may be a dummy word line. For example, the word line 332 and the word line 333 may be arranged near the boundary between the lower channel LCH and the upper channel UCH may be provided as the dummy word lines. In this case, data may not be stored in the memory cells connected to the dummy word line. In another example, the number of pages corresponding to the memory cells connected to the dummy word lines may be less than the number of pages corresponding to the memory cells connected to normal word lines. The voltage level applied to the dummy word lines may be different from the voltage level applied to the normal word lines, so that the non-uniform channel width between the lower channel LCH and the upper channel UCH may have less effect on the operation of the memory device 500.

In addition, the enlarged view A2 shows that the number of lower word lines 331 and 332 through which the lower channel LCH penetrates is less than the number of upper word lines 333 to 338 through the upper channel UCH penetrates. However, those configurations are disclosed for an example, and example embodiments are not limited thereto. In another example, the number of the lower word lines penetrating through the lower channel LCH may be equal to or greater than the number of the upper word lines penetrating through the upper channel UCH. In addition, the structures and connection configurations of the channel structure CH in the first cell region CELL1 described above may be applied equally to the channel structure CH in the second cell region CELL2.

In the bit line bonding area BLBA, a first penetrating electrode THV1 may be provided in the first cell region CELL1 and a second penetrating electrode THV2 may be provided in the second cell region CELL2. As shown in FIG. 16, the first penetrating electrode THV1 may penetrate through the common source line 320 and the plurality of word lines 330. However, those configurations are disclosed for an example, and the first penetrating electrode THV1 may further penetrate through the second substrate 310. In an example embodiment, the first penetrating electrode THV1 may include a conductive material. In another example embodiment, the first penetrating electrode THV1 may include a conductive material enclosed by an insulating material. The second penetrating electrode THV2 may have the same configurations and structures as the first penetrating electrode THV1.

In an example embodiment, the first penetrating electrode THV1 and the second penetrating electrode THV2 may be electrically connected to a first penetrating metal pattern 372d and a second penetrating metal pattern 472d, respectively. The first penetrating metal pattern 372d may be provided at a lower portion of the first upper chip including the first cell region CELL1, and the second penetrating metal pattern 472d may be arranged at an upper portion of the second upper chip including the second cell region CELL2. The first penetrating electrode THV1 may be electrically connected to the first metal wiring 350c and the second metal wiring 360c. A lower via 371d may be arranged between the first penetrating electrode THV1 and the first penetrating metal pattern 372d, and an upper via 471d may be arranged between the second penetrating electrode THV2 and the second penetrating metal pattern 472d. The first penetrating metal pattern 372d and the second penetrating metal pattern 472d may be bonded to each other by a bonding process.

In addition, in the bit line bonding area BLBA, an upper metal pattern 252 may be arranged on an uppermost metal layer of the peripheral circuit region PERI, and an upper metal pattern 392, which has the same shape as the upper metal pattern 252, may be arranged on an uppermost metal layer of the first cell region CELL1. The upper metal pattern 392 of the first cell region CELL1 and the upper metal pattern 252 of the peripheral circuit region PERI may be electrically connected to each other by the bonding process. In the bit line bonding area BLBA, the bit line 360c may be electrically connected to the page buffer in the peripheral circuit region PERI. For example, some of the circuit devices 220c of the peripheral circuit region PERI may provide a page buffer, and the bit line 360c may be electrically connected to some of the circuit devices 220c that provide the page buffer through the upper bonding metal 370c of the first cell region CELL1 and the upper bonding metal 270c of the peripheral circuit region PERI.

Referring again to FIG. 16, in the word line bonding area WLBA, the word lines 330 of the first cell region CELL1 may extend in a second direction (X-axis direction) parallel to the upper surface of the second substrate 310 and may be connected to a plurality of cell contact plugs 340 or 341-347. A first metal wiring 350b and a second metal wiring 360b may be sequentially connected to an upper portion of the cell contact plugs 340 connected to the word lines 330. The cell contact plugs 340 may be connected to the peripheral circuit region PERI through the upper bonding metal 370b of the first cell region CELL1 and the upper bonding metal 270b of the peripheral circuit region PERI in the word line bonding area WLBA.

The cell contact plugs 340 may be electrically connected to a row decoder in the peripheral circuit region PERI. For example, some of the circuit devices 220b in the peripheral circuit region PERI may provide
  the row decoder, and the cell contact plugs 340 may be connected to some of the circuit devices 220b that provide the row decoder through the upper bonding metal 370b of the first cell region CELL1 and the upper bonding metal 270b of the peripheral circuit region PERI. In an example embodiment, the operating voltage of the circuit devices 220b that provide the row decoder may be different from the operating voltage of the circuit devices 220c that provide the page buffer. For example, the operating voltage of the circuit devices 220c that provide the page buffer may be higher than the operating voltage of the circuit devices 220b that provide the row decoder.

In the same way, in the word line bonding area WLBA, the word lines 430 of the second cell region CELL2 may extend in the second direction (X-axis direction) parallel to the upper surface of the third substrate 410 and may be connected to a plurality of cell contact plugs 440 or 441-447. The cell contact plugs 440 may be connected to the peripheral circuit region PERI through an upper metal pattern of the second cell region CELL2, a lower metal pattern of the first cell region CELL1, and a cell contact plug 348.

In the word line bonding area WLBA, the upper bonding metal 370b may be provided in the first cell region CELL1, and the upper bonding metal 270b may be provided in the peripheral circuit region PERI. The upper bonding metal 370b of the first cell region CELL1 and the upper bonding metal 270b of the peripheral circuit region PERI may be electrically connected to each other by the bonding process. The upper bonding metal 370b and the upper bonding metal 270b may include aluminum (Al), copper (Cu), tungsten (W), and the like.

In the external pad bonding area PA, a lower metal pattern 371e may be arranged at a lower portion of the first cell region CELL1, and an upper metal pattern 472a may be arranged at an upper portion of the second cell region CELL2. In the external pad bonding area PA, the lower metal pattern 371e of the first cell region CELL1 and the upper metal pattern 472a of the second cell region CELL2 may be connected to each other by the bonding process. In the same way, an upper metal pattern 372a may be arranged on an upper portion of the first cell region CELL1, and an upper metal pattern 272a may be arranged on an upper part of the peripheral circuit region PERI. The upper metal pattern 372a of the first cell region CELL1 and the upper metal pattern 272a of the peripheral circuit region PERI may be connected to each other by the bonding process.

Common source line contact plugs 380 and 480 for the common source line may be arranged in the external pad bonding area PA. The common source line contact plugs 380 and 480 may include a conductive material such as a metal, a metal compound, and doped polysilicon. The common source line contact plug 380 in the first cell region CELL1 may be electrically connected to the common source line 320, and the common source line contact plug 480 in the second cell region CELL2 may be electrically connected to the common source line 420. A first metal wiring 350a and a second metal wiring 360a may be sequentially stacked on the contact plug 380 in the first cell region CELL1, and a first metal wiring 450a and a second metal wiring 460a may be sequentially stacked on the contact plug 480 in the second cell region CELL2.

A plurality of input/output pads 205, 405, and 406 may be arranged in the external pad bonding area PA. Referring to FIG. 16, a lower insulating layer 201 may cover a lower surface of the first substrate 210, and a first input/output pad 205 may be arranged on the lower insulating layer 201. The first input/output pad 205 may be connected to at least one of the plurality of circuit devices 220a in the peripheral circuit region PERI through a first input/output contact plug 203, and may be separated from the first substrate 210 by the lower insulating layer 201. In addition, a side insulating layer may be arranged between the first input/output contact plug 203 and the first substrate 210 to electrically separate the first input/output contact plug 203 and the first substrate 210.

An upper insulating layer 401 covering an upper surface of the third substrate 410 may be arranged on the third substrate 410. A second input/output pad 405 and/or a third input/output pad 406 may be arranged on the upper insulating layer 401. The second input/output pad 405 may be connected to at least one of the plurality of circuit devices 220a in the peripheral circuit region PERI through the second input/output contact plugs 403 and 303, and the third input/output pad 406 may be connected to at least one of the plurality of circuit devices 220a in the peripheral circuit region PERI.

In an example embodiment, the third substrate 410 may not be provided in an area in which the input/output contact plug is arranged. For example, as shown in enlarged views B1 and B2, the third input/output contact plug 404 may be separated from the third substrate 410 in a direction parallel to the upper surface of the third substrate 410, and may be connected to the third input/output pad 406 through the interlayer insulating layer 415 in the second cell region CELL2. In this case, the third input/output contact plug 404 may be formed by various processes.

For example, as shown in enlarged view B1, the third input/output contact plug 404 may extend in the third direction (Z-axis direction) and may have diameter increasing toward the upper insulating layer 401. That is, while the diameter of the channel structure CH shown in enlarged view A1 decreases toward the upper insulating layer 401, the diameter of the third input/output contact plug 404 may increase toward the upper insulating layer 401. For example, the third input/output contact plug 404 may be formed after the second cell region CELL2 and the first cell region CELL1 are combined to each other in the bonding process.

In addition, for example, as shown in enlarged view B2, the third input/output contact plug 404 may extend in the third direction (Z-axis direction) and may have a diameter decreasing toward the upper insulating layer 401. That is, the diameter of the third input/output contact plug 404 may decrease toward the upper insulating layer 401 like the channel structure CH. For example, the third input/output contact plug 404 may be formed together with the cell contact plugs 440 before bonding the second cell region CELL2 and the first cell region CELL1.

In another example embodiment, the input/output contact plugs may be arranged to overlap the third substrate 410. For example, as shown in enlarged views C1, C2 and C3, the second input/output contact plug 403 may penetrate through the interlayer insulating layer 415 in the second cell region CELL2 in the third direction (Z-axis direction), and may be electrically connected to the second input/output pad 405 through the third substrate 410. In this case, a connection structure between the second input/output contact plug 403 and the second input/output pad 405 may be implemented in various ways.

For example, as shown in enlarged view C1, an opening 408 penetrating the third substrate 410 may be formed, and the second input/output contact plug 403 may be directly connected to the second input/output pad 405 through the opening 408 of the third substrate 410. In this case, as shown in enlarged view C1, the diameter of the second input/output contact plug 403 may increase toward the second input/output pad 405. However, those configurations are disclosed for an example, and the diameter of the second input/output contact plug 403 may decrease toward the second input/output pad 405.

For example, as shown in enlarged view C2, an opening 408 penetrating the third substrate 410 may be provided, and a contact 407 may be provided in the opening 408. One end of the contact 407 may be connected to the second input/output pad 405, and the other end of the contact 407 may be connected to the second input/output contact plug 403. Accordingly, the second input/output contact plug 403 may be electrically connected to the second input/output pad 405 through the contact 407 in the opening 408. In this case, as shown in enlarged view C2, the diameter of the contact 407 may increase toward the second input/output pad 405, and the diameter of the second input/output contact plug 403 may decrease toward the second input/output pad 405. For example, the second input/output contact plug 403 may be formed together with the cell contact plugs 440 before bonding the second cell region CELL2 and the first cell region CELL1, and the contact 407 may be formed after bonding the second cell region CELL2 and the first cell region CELL1.

In addition, for example, as shown in enlarged view C3, a stopper 409 may be further provided on the upper surface of the opening 408 of the third substrate 410, as is compared with enlarge view C2. The stopper 409 may include a metal wiring that is arranged on the same layer as the common source line 420. However, those configurations are disclosed for an example, and the stopper 409 may include a metal wiring that is arranged on the same layer as at least one of the word lines 430. The second input/output contact plug 403 may be electrically connected to the second input/output pad 405 through the contact 407 and the stopper 409.

In addition, similarly to the second and third input/output contact plugs 403 and 404 in the second cell region CELL2, the second and third input/output contact plugs 303 and 304 in the first cell region CELL1 may have a diameter decreasing or increasing toward the lower metal pattern 371e.

In some example embodiments, a slit 411 may be provided in the third substrate 410. For example, the slit 411 may be provided at any position in the external pad bonding area PA. For example, as shown in enlarged view D, the slit 411 may be positioned between the second input/output pad 405 and the plurality of cell contact plugs 440 when viewed from a plan. However, those configurations are disclosed for an example, and in a plan view, the slit 411 may be provided such that the second input/output pad 405 is positioned between the slit 411 and the plurality of cell contact plugs 440.

For example, as shown in enlarged view D1, the slit 411 may be provided to penetrate the third substrate 410. The slit 411 may be used, for example, for preventing the third substrate 410 from finely splitting when the opening 408 is formed. However, those configurations are disclosed for an example, and the slit 411 may be formed to a depth of about 60% to about 70% with respect to the thickness of the third substrate 410.

In addition, for example, as shown in enlarged view D2, a conductive material 412 may be provided in the slit 411. The conductive material 412 may be used, for example, for discharging the leakage current, which is generated in driving the circuit devices in the external pad bonding area PA, to the outside. In this case, the conductive material 412 may be connected to an external ground line.

In addition, for example, as shown in enlarged view D3, an insulating material 413 may be provided in the slit 411. The insulating material 413 may be provided, for example, for electrically separating the second input/output pad 405 and the second input/output contact plug 403 in the external pad bonding area PA from the word line bonding area WLBA. Due to the insulating material 413 in the slit 411, the metal layer on the third substrate 410 in the word line bonding area WLBA may be prevented from being influenced by the voltage provided through the second input/output pad 405.

In an example embodiment, the first to third input/output pads 205, 405, and 406 may be selectively formed in the memory device 500. For example, the memory device 500 may be implemented to include only the first input/output pad 205 over the first substrate 210, only the second input/output pad 405 over the third substrate 410, or only the third input/output pad 406 over the upper insulating layer 401.

In some example embodiments, at least one of the second substrate 310 in the first cell region CELL1 and the third substrate 410 in the second cell region CELL2 may be used as a sacrificial substrate, and the sacrificial substrate may be partially or entirely removed before or after the bonding process. After removing the substrate, an additional layer may be stacked. For example, the second substrate 310 in the first cell region CELL1 may be removed before or after the bonding of the peripheral circuit region PERI and the first cell region CELL1, and an insulating layer or a conductive layer for connection may be formed to cover an upper surface of the common source line 320. Similarly, the third substrate 410 in the second cell region CELL2 may be removed before or after the bonding of the first cell region CELL1 and the second cell region CELL2, and the insulating layer or a conductive layer for connection may be formed to cover the upper surface of the common source line 320.

Herein, the upper bonding metals 270c in the peripheral circuit region PERI may be arranged over a circuit area of the page buffer and may be arranged in a matrix form in the first direction X and the second direction Y. The circuit area of the page buffer may correspond to the bit line bonding area BLBA. For example, the upper bonding metals 270c may be grouped into a plurality of bonding pad groups, and each bonding pad group may include some upper bonding metals 270c arranged in a line along the first direction Y. In an example embodiment, the peripheral circuit region PERI may include a plurality of penetrating wirings extending in the first direction Y. For example, each penetrating wire may be arranged between the bonding pad groups adjacent to each other.

Figure 17:
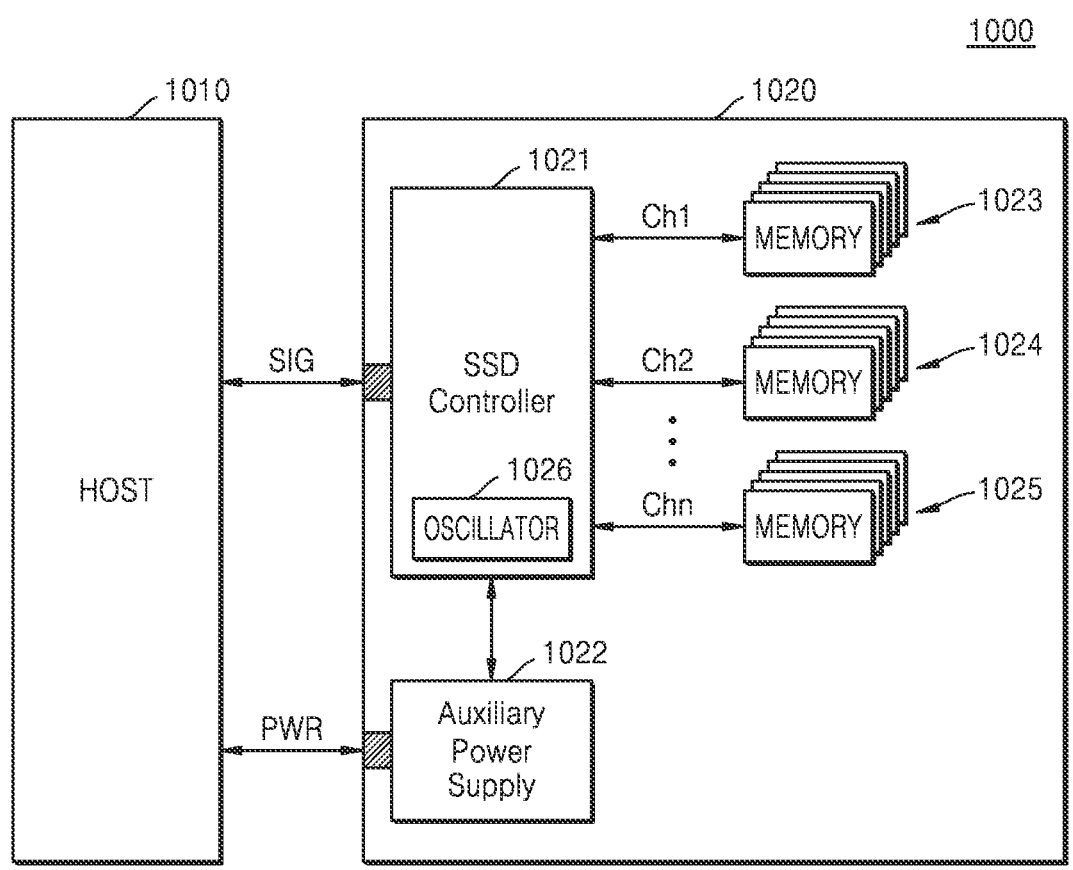
FIG. 17 is a block diagram showing a solid-state drive (SSD) system according to an example embodiment.

FIG. 17 is a block diagram showing a solid state drive (SSD) system, according to an example embodiment.

Referring to FIG. 17, the SSD system 800 may include a host 1010 and an SSD 1020. The SSD 1020 may transmit and receive signals to and from the host 1010 through a signal connector and may receive power through the power connector. The SSD 1020 may include an SSD controller 1021, an auxiliary power supply 1022, and memory devices 1023, 1024, and 1025. The SSD controller 1021 may include an oscillator 1026. The oscillator 1026 may correspond to the clock signal generator 10 shown in FIG. 1A. The oscillator 1026 may be implemented to be included in the SSD system 1000, but is not limited thereto the example embodiment of FIG. 16 in which the SSD controller 1021 includes the oscillator 1026. The memory devices 1023, 1024, and 1025 may include vertically stacked NAND flash memory devices. The oscillator 1026 may provide a clock signal having a certain cycle to the SSD controller 1021.

While aspects of example embodiments have been particularly shown and described, it will be understood that various changes in form and details may be made therein without departing from the spirit and scope of the following claims.

What is claimed is:

1. A method of generating clock signals, the method comprising:
   receiving a bandgap reference voltage from a bandgap reference circuit;
   generating a first current having a first curvature characteristic based on the bandgap reference voltage;
   generating a second current having a second curvature characteristic based on the bandgap reference voltage;
   generating a first complementary to absolute temperature (CTAT) current by adding the first current to the second current;
   receiving a temperature-variable voltage and a temperature-fixed voltage from a voltage generator;
   generating an offset current based on the temperature-variable voltage and the temperature-fixed voltage;
   generating a reference current by adding the first CTAT current to the offset current; and
   generating the clock signals by alternately discharging a first capacitor and a second capacitor based on the reference current, and charging the first capacitor and the second capacitor based on a power voltage.

2. The method of claim 1, wherein the first current is a second CTAT current in which a rate of change of current with respect to temperature increases as the temperature increases, and
   wherein the second current is a third CTAT current in which a rate of change of current with respect to temperature decreases as the temperature increases.

3. The method of claim 2, wherein a sum of the first current and the second current has a rate of change of current which is linear.

4. The method of claim 1, wherein the offset current is a proportional to absolute temperature (PTAT) current.

5. The method of claim 4, wherein the reference current is a constant current that is constant with respect to a temperature change.

6. The method of claim 4, wherein the reference current is an increasing current that increases with a temperature change.

7. The method of claim 1, wherein the offset current is a fourth CTAT current.

8. A method of generating clock signals, the method comprising:
   receiving a bandgap reference voltage from a bandgap reference circuit;
   generating a first current having a first curvature characteristic based on the bandgap reference voltage;
   generating a second current having a second curvature characteristic based on the bandgap reference voltage;
   generating a first complementary to absolute temperature (CTAT) current by adding the first current to the second current;
   receiving a temperature-variable current and a temperature-fixed current from a current generator;
   controlling a first p-type metal oxide semiconductor (PMOS) transistor to generate a first offset current based on the temperature-fixed current;
   controlling a second PMOS transistor to generate a second offset current based on the temperature-variable current;
   generating an offset current based on the first offset current and the second offset current;
   generating a reference current by adding the first CTAT current to the offset current; and
   generating the clock signals by alternately discharging a first capacitor and a second capacitor based on the reference current, and charging the first capacitor and the second capacitor based on a power voltage,
   wherein a source terminal of the first PMOS transistor is connected to a source terminal of the second PMOS transistor.

9. An apparatus comprising:
   a complementary to absolute temperature (CTAT) current generating circuit configured to receive a bandgap reference voltage from a bandgap reference circuit, generate a first current having a first curvature characteristic based on the bandgap reference voltage, generate a second current having a second curvature characteristic based on the bandgap reference voltage, and generate a first CTAT current by adding the first current to the second current;
   an offset current generating circuit configured to receive a temperature-variable voltage and a temperature-fixed voltage from a voltage generator, generate an offset current based on the temperature-variable voltage and the temperature-fixed voltage, and generate a reference current by adding the first CTAT current to the offset current; and
   a clock signal generating circuit configured to generate clock signals by alternately discharging a first capacitor and a second capacitor based on the reference current, and charging the first capacitor and the second capacitor based on a power voltage.

10. The apparatus of claim 9, wherein the CTAT current generating circuit comprises a first curvature compensation circuit and a second curvature compensation circuit,
    wherein the first curvature compensation circuit is configured to generate the first current based on a driving voltage of a first p-type metal oxide semiconductor (PMOS) transistor and the bandgap reference voltage, wherein the first current flows through a first resistor, and
    wherein the second curvature compensation circuit is configured to generate the second current based on the bandgap reference voltage, wherein the second current flows through a second resistor to a ground node.

11. The apparatus of claim 9, wherein the first current is a second CTAT current in which a rate of change of current with respect to temperature increases as the temperature increases, and
    wherein the second current is a third CTAT current in which a rate of change of current with respect to temperature decreases as the temperature increases.

12. The apparatus of claim 11, wherein a sum of the first current and the second current has a rate of change of current which is linear.

13. The apparatus of claim 9, wherein the offset current generating circuit comprises:
    a first n-type metal oxide semiconductor (NMOS) transistor configured to mirror the first CTAT current;
    a first current mirror circuit configured to generate a third current by adding the mirrored first CTAT current to a first offset current;
    a second current mirror circuit configured to generate a reference current based on a difference between the third current and a second offset current; and
    a third current mirror circuit for mirroring the reference current.

14. The apparatus of claim 13, wherein the temperature-fixed voltage is applied to a gate terminal of a second p-type metal oxide semiconductor (PMOS) transistor of the first current mirror circuit, the temperature-variable voltage is applied to a gate terminal of a third PMOS transistor of the second current mirror circuit, and wherein the offset current is a proportional to absolute temperature (PTAT) current.

15. The apparatus of claim 14, wherein the reference current is a constant current that is constant with respect to a temperature change.

16. The apparatus of claim 14, wherein the reference current is an increasing current that increases with respect to a temperature change.

17. The apparatus of claim 13, wherein the temperature-variable voltage is applied to a gate terminal of a second p-type metal oxide semiconductor (PMOS) transistor of the first current mirror circuit, the temperature-fixed voltage is applied to a gate terminal of a third PMOS transistor of the second current mirror circuit, and wherein the offset current is a fourth CTAT current.

18. The apparatus of claim 9, wherein the offset current is controlled by controlling a current mirror ratio based on a temperature code received from a digital temperature sensor.

19. The apparatus of claim 9, wherein a frequency of a cycle of the clock signals is inversely proportional to the reference current.

20. The apparatus of claim 9, further comprising:

a memory cell array comprising a plurality of memory blocks, each of the plurality of memory blocks comprising a plurality of memory cells connected to a plurality of word lines and a plurality of bit lines;

a row decoder configured to identify a selected memory block, from among the plurality of memory blocks, according to an address;

the voltage generator configured to provide a word line voltage to the plurality of word lines;

page buffers connected to the plurality of bit lines and configured to read data from the plurality of memory cells connected to a selected word line of the selected memory block; and a control logic circuit configured to control, based on the clock signals, the row decoder, the voltage generator, and the page buffers.

* * * * *